United States Patent
Ryu et al.

(10) Patent No.: US 12,336,437 B2
(45) Date of Patent: Jun. 17, 2025

(54) SEMICONDUCTOR DEVICES AND METHODS OF FABRICATING THE SAME

(71) Applicant: Samsung Electronics Co., Ltd., Suwon-si (KR)

(72) Inventors: Kyounghun Ryu, Gumi-si (KR); Shin Kwon, Yongin-si (KR); Byoungjae Bae, Hwaseong-si (KR); Hyunchul Shin, Seoul (KR); Gawon Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 605 days.

(21) Appl. No.: 17/488,592

(22) Filed: Sep. 29, 2021

(65) Prior Publication Data

US 2022/0254990 A1    Aug. 11, 2022

(30) Foreign Application Priority Data

Feb. 8, 2021  (KR) .................. 10-2021-0017263

(51) Int. Cl.
*H10N 50/80* (2023.01)
*H10B 61/00* (2023.01)
*H10N 50/01* (2023.01)

(52) U.S. Cl.
CPC ............. *H10N 50/80* (2023.02); *H10B 61/00* (2023.02); *H10N 50/01* (2023.02)

(58) Field of Classification Search
CPC ........ H10N 50/80; H10N 50/01; H10N 50/10; H10B 61/00; H01L 27/0207
See application file for complete search history.

(56) References Cited

U.S. PATENT DOCUMENTS

| | | | |
|---|---|---|---|
| RE40,995 E | * | 11/2009 | Ghodsi .................. H10B 63/00 365/158 |
| 8,535,952 B2 | | 9/2013 | Malmhall et al. |
| 8,558,334 B2 | | 10/2013 | Hayashi et al. |
| 9,508,925 B2 | | 11/2016 | Pi et al. |

(Continued)

FOREIGN PATENT DOCUMENTS

| CN | 109087994 A | * | 12/2018 | ......... G11C 11/1655 |
|---|---|---|---|---|
| CN | 112563275 A | * | 3/2021 | ........... G11C 11/161 |

(Continued)

*Primary Examiner* — Mohammed Shamsuzzaman
(74) *Attorney, Agent, or Firm* — Myers Bigel, P.A.

(57) ABSTRACT

A semiconductor device includes a substrate including a first region and a second region, data storage patterns on the first region and spaced apart from each other in a first direction, an upper insulating layer on the first and second regions and on the data storage patterns, a cell line structure penetrating the upper insulating layer on the first region, extending in the first direction, and electrically connected to the data storage patterns, and an upper connection structure penetrating the upper insulating layer on the second region. The upper connection structure includes an upper conductive line, and upper conductive contacts arranged along a bottom surface of the upper conductive line. The bottom surface of the upper conductive line is located at a height higher than a bottom surface of the cell line structure. A side surface of the cell line structure has a straight line shape continuously-extended.

17 Claims, 18 Drawing Sheets

(56) References Cited

U.S. PATENT DOCUMENTS

| | | | | |
|---|---|---|---|---|
| 9,685,606 B2* | 6/2017 | Park | ............... | H01L 21/32131 |
| 9,704,919 B1* | 7/2017 | Lu | ............... | H01L 21/3212 |
| 9,741,415 B2* | 8/2017 | Han | ............... | H10N 50/80 |
| 9,780,301 B1* | 10/2017 | Chuang | ............... | H10N 50/10 |
| 9,806,028 B2* | 10/2017 | Lee | ............... | H10B 63/80 |
| 9,842,986 B2* | 12/2017 | Chuang | ............... | H10N 50/80 |
| 9,893,272 B2* | 2/2018 | Kang | ............... | H10B 61/00 |
| 10,043,853 B2* | 8/2018 | Sugiura | ............... | H10N 50/80 |
| 10,199,431 B2* | 2/2019 | Jeong | ............... | H10N 50/80 |
| 10,504,958 B2* | 12/2019 | Kalnitsky | ............... | H10B 61/20 |
| 11,121,087 B2* | 9/2021 | LiCausi | ............... | H01L 23/528 |
| 11,127,789 B2* | 9/2021 | Cho | ............... | H10N 50/80 |
| 11,133,321 B2* | 9/2021 | Chuang | ............... | H01L 25/0655 |
| 11,158,671 B2* | 10/2021 | Kim | ............... | H10B 61/22 |
| 11,211,425 B2* | 12/2021 | Lee | ............... | H01L 23/5226 |
| 11,690,231 B2* | 6/2023 | Ko | ............... | H10B 63/80 |
| | | | | 257/421 |
| 2004/0165427 A1* | 8/2004 | Jeong | ............... | G11C 11/15 |
| | | | | 365/171 |
| 2006/0211231 A1* | 9/2006 | Asano | ............... | H10B 63/30 |
| | | | | 438/593 |
| 2010/0001356 A1* | 1/2010 | Kim | ............... | H10N 50/01 |
| | | | | 257/E29.323 |
| 2011/0049656 A1* | 3/2011 | Li | ............... | G11C 11/161 |
| | | | | 700/121 |
| 2011/0229985 A1* | 9/2011 | Li | ............... | H10N 50/01 |
| | | | | 257/E21.665 |
| 2013/0221417 A1* | 8/2013 | Lee | ............... | H01L 29/82 |
| | | | | 257/295 |
| 2014/0117477 A1* | 5/2014 | Park | ............... | G11C 11/161 |
| | | | | 257/421 |
| 2015/0017743 A1* | 1/2015 | Lee | ............... | H10B 61/22 |
| | | | | 438/3 |
| 2015/0287907 A1* | 10/2015 | Park | ............... | H10N 50/01 |
| | | | | 257/421 |
| 2015/0311429 A1* | 10/2015 | Li | ............... | H10B 61/10 |
| | | | | 257/421 |
| 2015/0311433 A1* | 10/2015 | Bae | ............... | H10N 50/01 |
| | | | | 438/669 |
| 2016/0079518 A1* | 3/2016 | Pi | ............... | H10N 50/10 |
| | | | | 257/421 |
| 2017/0092692 A1* | 3/2017 | Kalnitsky | ............... | G11B 5/3909 |
| 2017/0092850 A1* | 3/2017 | Lee | ............... | H10N 50/01 |
| 2017/0170386 A1* | 6/2017 | Chuang | ............... | H10N 50/85 |
| 2017/0243923 A1* | 8/2017 | Jeong | ............... | G11C 13/004 |
| 2017/0244030 A1* | 8/2017 | Park | ............... | H10N 70/841 |
| 2017/0301728 A1* | 10/2017 | Chuang | ............... | H10N 50/80 |
| 2017/0324025 A1* | 11/2017 | Lee | ............... | H10N 50/01 |
| 2018/0040817 A1* | 2/2018 | Chuang | ............... | H10N 70/20 |
| 2018/0076263 A1* | 3/2018 | Sugiura | ............... | H10N 50/80 |
| 2018/0097173 A1* | 4/2018 | Chuang | ............... | H10N 50/10 |
| 2018/0159023 A1* | 6/2018 | Suh | ............... | H10N 50/80 |
| 2018/0182809 A1* | 6/2018 | Liu | ............... | H10N 50/01 |
| 2018/0182810 A1* | 6/2018 | Yi | ............... | H10B 61/10 |
| 2018/0197914 A1* | 7/2018 | Jeong | ............... | H10N 50/80 |
| 2018/0211995 A1* | 7/2018 | Bak | ............... | H10N 50/01 |
| 2018/0248111 A1* | 8/2018 | Raghavan | ............... | H10N 50/80 |
| 2018/0350875 A1* | 12/2018 | Han | ............... | H10B 61/00 |
| 2018/0358555 A1* | 12/2018 | Lee | ............... | H10B 43/27 |
| 2018/0374895 A1* | 12/2018 | Hsu | ............... | H10N 50/01 |
| 2019/0088656 A1* | 3/2019 | Kim | ............... | G11C 11/161 |
| 2019/0131346 A1* | 5/2019 | Lin | ............... | H01L 21/76802 |
| 2019/0165041 A1* | 5/2019 | Chuang | ............... | H10B 61/22 |
| 2019/0371996 A1* | 12/2019 | Chuang | ............... | H10B 61/22 |
| 2020/0006635 A1* | 1/2020 | Rahman | ............... | G11C 11/161 |
| 2020/0006638 A1* | 1/2020 | Chen | ............... | H10B 61/22 |
| 2020/0035908 A1* | 1/2020 | Ku | ............... | H01F 41/34 |
| 2020/0075669 A1* | 3/2020 | Chuang | ............... | H10N 50/10 |
| 2020/0098982 A1* | 3/2020 | Chuang | ............... | H10B 61/22 |
| 2020/0111950 A1* | 4/2020 | Chen | ............... | H10N 50/80 |
| 2020/0135806 A1* | 4/2020 | Peng | ............... | G11C 11/005 |
| 2020/0266335 A1* | 8/2020 | Wang | ............... | H10N 50/80 |
| 2020/0343299 A1* | 10/2020 | Hsu | ............... | H10N 50/01 |
| 2020/0411695 A1* | 12/2020 | Sung | ............... | H01L 29/6684 |
| 2021/0057639 A1* | 2/2021 | Ku | ............... | H10N 50/10 |
| 2021/0083174 A1* | 3/2021 | Aggarwal | ............... | H10B 61/00 |
| 2021/0091139 A1* | 3/2021 | Tseng | ............... | H10N 50/10 |
| 2021/0098465 A1* | 4/2021 | Chuang | ............... | H01F 10/329 |
| 2021/0111333 A1* | 4/2021 | Chang | ............... | H10N 50/01 |
| 2021/0217812 A1* | 7/2021 | Hsiao | ............... | H10B 61/00 |
| 2021/0273156 A1* | 9/2021 | Chen | ............... | H10N 50/10 |
| 2021/0336130 A1* | 10/2021 | Chien | ............... | H10N 50/10 |
| 2021/0351348 A1* | 11/2021 | Hsu | ............... | H10N 70/063 |
| 2021/0375987 A1* | 12/2021 | Chuang | ............... | H10B 61/22 |
| 2021/0391532 A1* | 12/2021 | Yin | ............... | H10B 61/22 |
| 2022/0020920 A1* | 1/2022 | Chen | ............... | H10B 61/00 |
| 2022/0029093 A1* | 1/2022 | Chuang | ............... | H10N 50/01 |
| 2022/0093684 A1* | 3/2022 | Chuang | ............... | H10N 50/80 |
| 2022/0165936 A1* | 5/2022 | Shen | ............... | H10N 50/85 |
| 2022/0246837 A1* | 8/2022 | Lee | ............... | H10B 61/22 |
| 2022/0328083 A1* | 10/2022 | Ko | ............... | H10N 50/85 |
| 2023/0136650 A1* | 5/2023 | Dutta | ............... | H10N 50/01 |
| | | | | 257/427 |
| 2023/0139618 A1* | 5/2023 | Bae | ............... | H10N 50/01 |
| | | | | 257/421 |
| 2023/0263069 A1* | 8/2023 | Yang | ............... | H10N 50/85 |
| | | | | 257/421 |
| 2023/0380291 A1* | 11/2023 | Chien | ............... | H10N 50/10 |

FOREIGN PATENT DOCUMENTS

| | | | | |
|---|---|---|---|---|
| CN | 113206188 A | * | 8/2021 | ............ H01L 27/226 |
| DE | 112016006556 T5 | * | 11/2018 | ............ G11C 11/161 |
| KR | 100211956 B1 | | 8/1999 | |
| KR | 100434954 B1 | | 6/2004 | |
| TW | 202105782 A | * | 2/2021 | ............ G11C 11/161 |

* cited by examiner

SEMICONDUCTOR DEVICES AND METHODS OF FABRICATING THE SAME

CROSS-REFERENCE TO RELATED APPLICATION(S)

This U.S. non-provisional patent application claims priority under 35 U.S.C. § 119 to Korean Patent Application No. 10-2021-0017263, filed on Feb. 8, 2021, in the Korean Intellectual Property Office, the entire contents of which are hereby incorporated by reference.

BACKGROUND

The present disclosure relates to semiconductor devices. As the demand for electronic devices with increased speed and/or reduced power consumption increases, the demand for semiconductor memory devices with faster operating speeds and/or lower operating voltages is increasing. A magnetic memory device has been proposed to satisfy such a demand. For example, the magnetic memory device can provide technical advantages, such as high speed and/or non-volatility, and thus, the magnetic memory device is emerging as a next-generation memory device.

In general, the magnetic memory device includes a magnetic tunnel junction (MTJ) pattern. The MTJ pattern includes two magnetic layers and an insulating layer interposed therebetween. Resistance of the MTJ pattern may vary depending on magnetization directions of the magnetic layers. For example, the resistance of the MTJ pattern is higher when magnetization directions of the magnetic layers are anti-parallel to each other than when they are parallel to each other. Such a difference in resistance can be used for data storing/reading operations of the magnetic memory device.

An embedded structure of the magnetic memory device, in which the MTJ pattern is disposed between metal lines, is being developed to meet various demands for the electronics industry.

SUMMARY

An embodiment of the inventive concept provides a semiconductor device with a reduced pattern failure rate and a method of fabricating the same.

An embodiment of the inventive concept provides a method of easily fabricating a semiconductor device and a semiconductor device fabricated thereby.

According to an embodiment of the inventive concept, a semiconductor device may include a substrate including a first region and a second region, data storage patterns on the first region of the substrate and spaced apart from each other in a first direction parallel to a top surface of the substrate, an upper insulating layer on the first region of the substrate and on the data storage patterns and extending onto the second region of the substrate, a cell line structure penetrating the upper insulating layer on the first region of the substrate, extending in the first direction, and electrically connected to the data storage patterns, and an upper connection structure penetrating the upper insulating layer on the second region of the substrate. The upper connection structure may include an upper conductive line that extends in the first direction, and upper conductive contacts that are arranged along a bottom surface of the upper conductive line and are spaced apart from each other in the first direction. The bottom surface of the upper conductive line may be located at a height higher than a bottom surface of the cell line structure, relative to the substrate. A side surface of the cell line structure may have a straight line shape continuously-extending between the bottom surface of the cell line structure and a top surface of the cell line structure, when viewed in a sectional view.

According to an embodiment of the inventive concept, a semiconductor device may include a substrate including a first region and a second region, data storage patterns on the first region of the substrate and spaced apart from each other in a first direction parallel to a top surface of the substrate, a cell line structure on the first region of the substrate and on the data storage patterns and extending in the first direction to electrically connect to the data storage patterns, and an upper connection structure on the second region of the substrate. The upper connection structure may include an upper conductive line that extends in the first direction, and upper conductive contacts that are arranged along a bottom surface of the upper conductive line and are spaced apart from each other in the first direction. The bottom surface of the upper conductive line may be located at a height higher than a bottom surface of the cell line structure, relative to the substrate. An entire side surface of the cell line structure may have a straight line shape, when viewed in a sectional view.

A semiconductor device may include a substrate and data storage patterns on the substrate. The semiconductor device may include a cell line structure on the data storage patterns. The cell line structure may include a bottom surface, a top surface, and a pair of parallel opposing side surfaces that extend continuously between the bottom surface and the top surface. Moreover, the semiconductor device may include a conductive line on the substrate, and a bottom surface of the conductive line may be at a level between a level of the bottom surface of the cell line structure and a level of the top surface of the cell line structure.

According to an embodiment of the inventive concept, a method of fabricating a semiconductor device may include providing a substrate including a first region and a second region, forming data storage patterns on the first region of the substrate, forming a lower connection structure on the second region of the substrate, forming an upper insulating layer on the data storage patterns and on the lower connection structure, forming mask patterns on the upper insulating layer to extend in a first direction and to be spaced apart from each other in a second direction crossing the first direction, the first direction and the second direction being parallel to a top surface of the substrate, forming a sacrificial pattern to cover the mask patterns on the second region and to expose the mask patterns on the first region, the sacrificial pattern having a plurality of sacrificial openings, which are spaced apart from each other in the first direction between adjacent ones of the mask patterns, and etching the upper insulating layer using the mask patterns on the first region and the sacrificial pattern as an etch mask to simultaneously form a first trench that extends in the first direction, in the upper insulating layer on the first region, and first holes, which are spaced apart from each other in the first direction, in the upper insulating layer on the second region.

DETAILED DESCRIPTION

Example embodiments of the inventive concepts will now be described more fully with reference to the accompanying drawings, in which example embodiments are shown.

Figure 1:
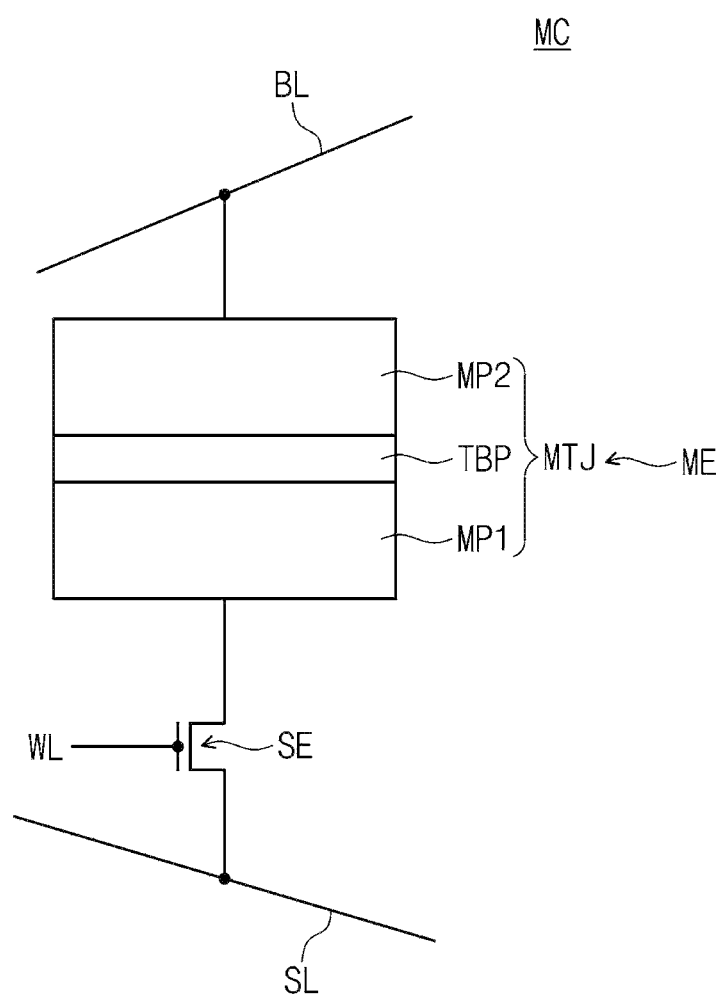
FIG. 1 is a circuit diagram illustrating a unit memory cell of a semiconductor device according to an embodiment of the inventive concept.

FIG. 1 is a circuit diagram illustrating a unit memory cell of a semiconductor device according to an embodiment of the inventive concept.

Referring to FIG. 1, a unit memory cell MC may include a memory device ME and a selection element SE. The memory device ME and the selection element SE may be electrically connected to each other in series. The memory device ME may be provided between and connected to a bit line BL and the selection element SE. The selection element SE may be provided between and connected to the memory device ME and a source line SL and may be controlled by a word line WL. The selection element SE may include, for example, a bipolar transistor or a metal-oxide-semiconductor (MOS) field effect transistor.

The memory device ME may include a magnetic tunnel junction MTJ including magnetic patterns MP1 and MP2, which are spaced apart from each other, and a tunnel barrier pattern TBP, which is interposed between the magnetic patterns MP1 and MP2. One of the magnetic patterns MP1 and MP2 may have a fixed magnetization direction, regardless of the presence of an external magnetic field generated under a typical user condition, and thus, it may serve as a reference magnetic pattern of the magnetic tunnel junction MTJ. The other of the magnetic patterns MP1 and MP2 may have a magnetization direction, which can be changed to one of two stable magnetization directions by an external magnetic field, and thus, it may serve as a free magnetic pattern of the magnetic tunnel junction MTJ. The electrical resistance of the magnetic tunnel junction MTJ may be much greater when magnetization directions of the reference and free magnetic patterns are antiparallel than when they are parallel. In other words, the electrical resistance of the magnetic tunnel junction MTJ may be controlled by adjusting the magnetization direction of the free magnetic pattern. Thus, a difference in electrical resistance of the magnetic tunnel junction pattern MTJ, which is caused by a difference in magnetization direction between the reference and free magnetic patterns, may be used as a data storing mechanism in the memory device ME of the unit memory cell MC.

Figure 2:
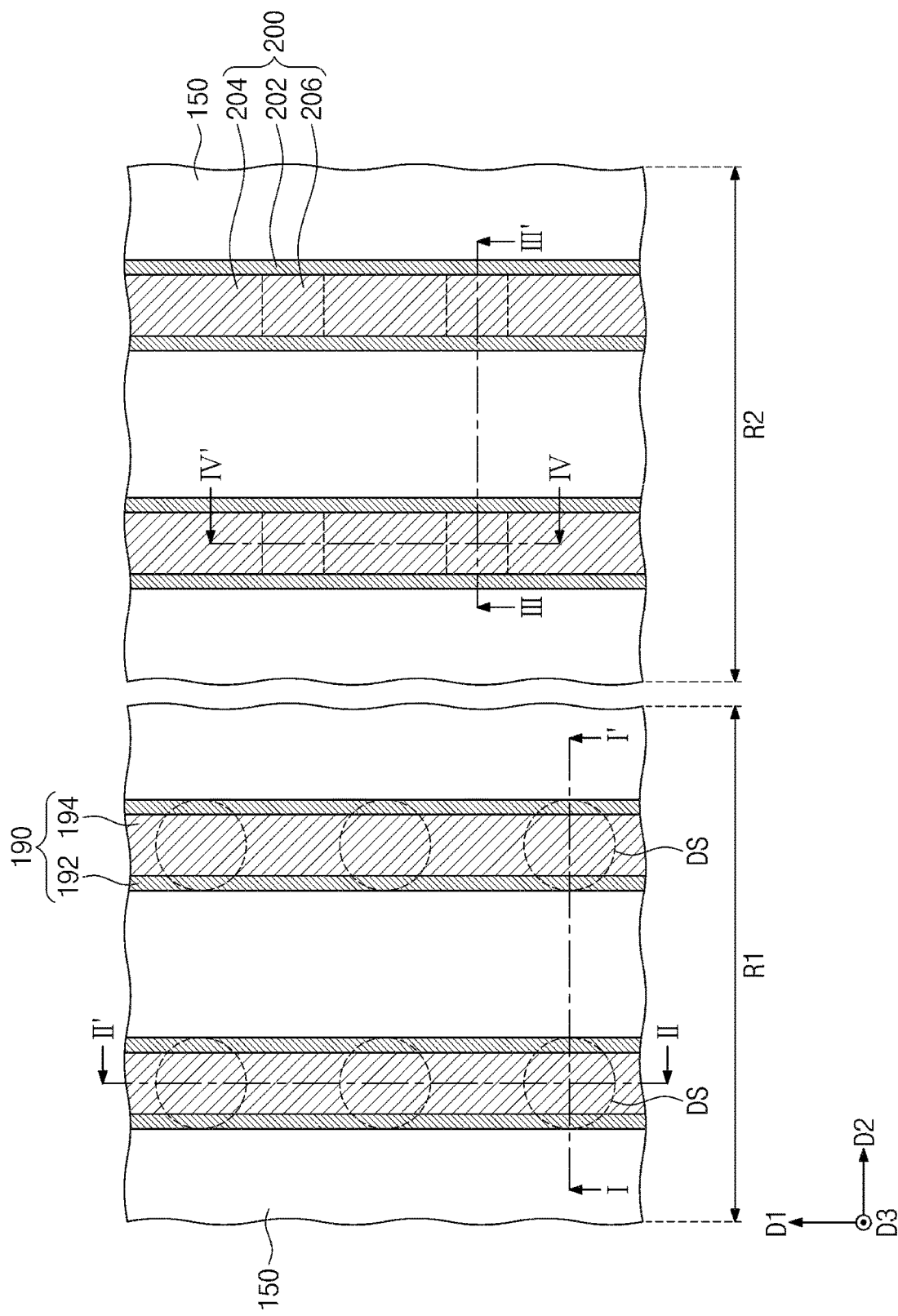
FIG. 2 is a plan view illustrating a semiconductor device according to an embodiment of the inventive concept.
Figure 3:
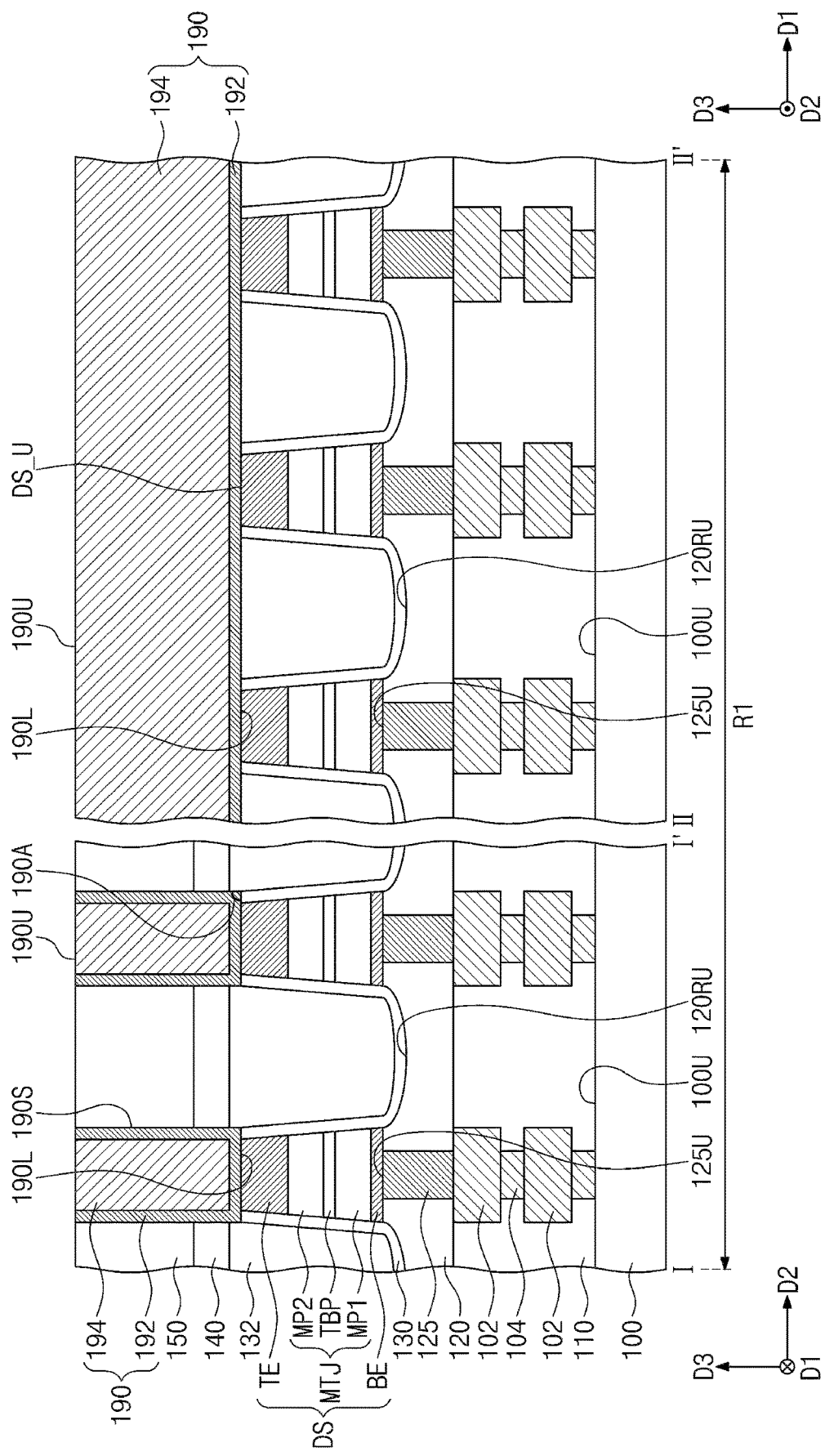
FIG. 3 is a sectional view taken along lines I-I' and II-II' of FIG. 2.
Figure 4:
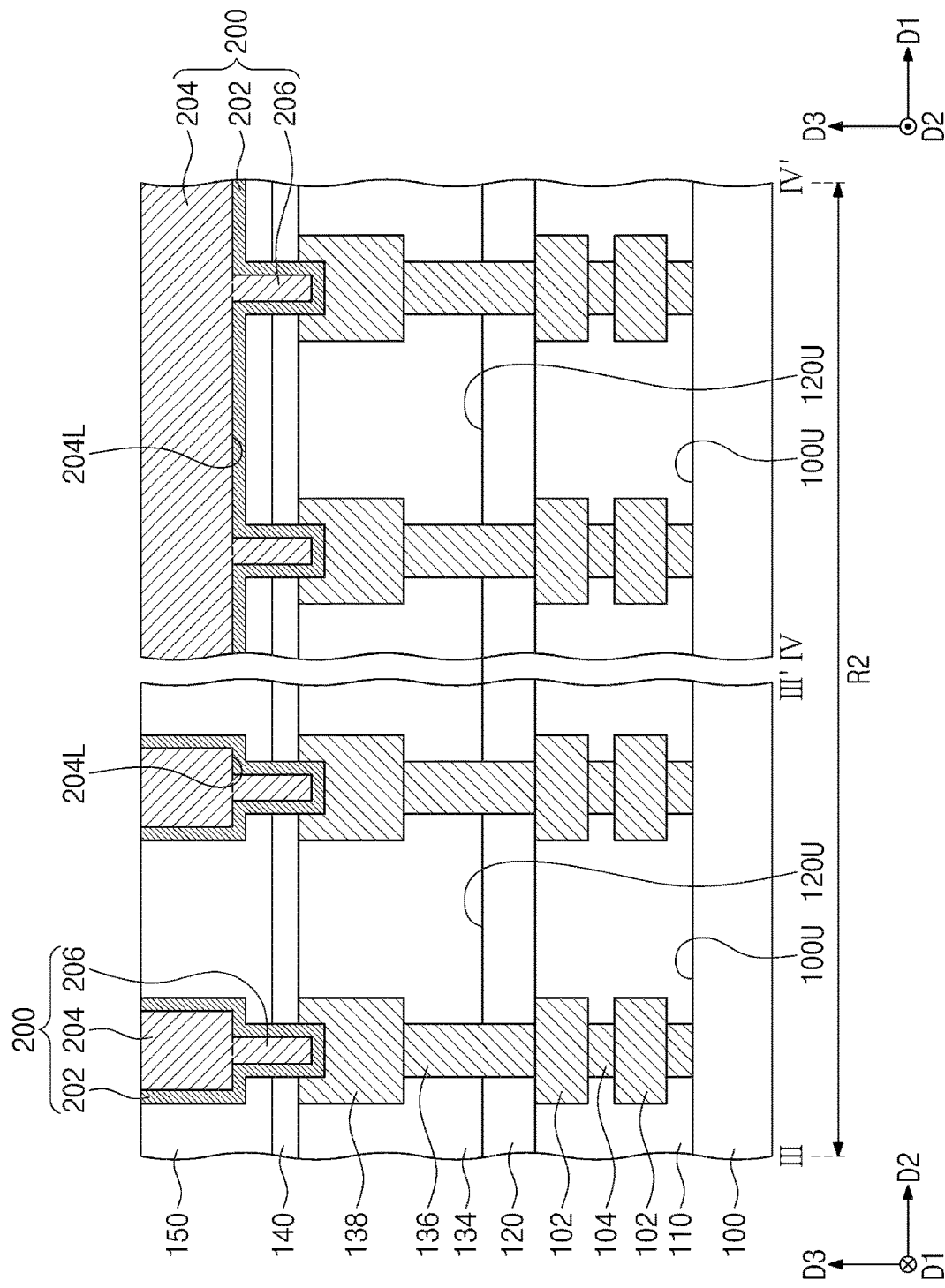
FIG. 4 is a sectional view taken along lines III-III' and IV-IV' of FIG. 2.
Figure 5A:
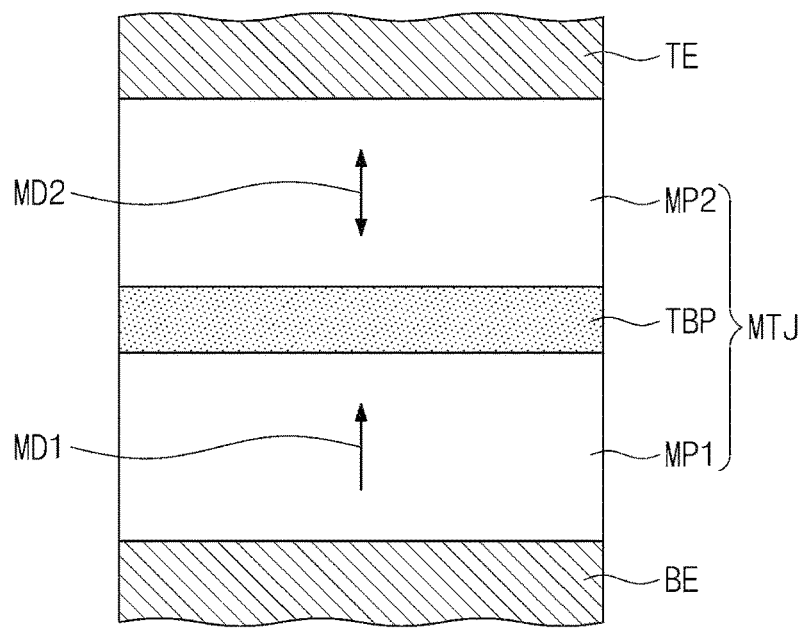
FIGS. 5A and 5B are sectional views illustrating two different examples of a magnetic tunnel junction pattern of a semiconductor device according to an embodiment of the inventive concept.
Figure 5B:
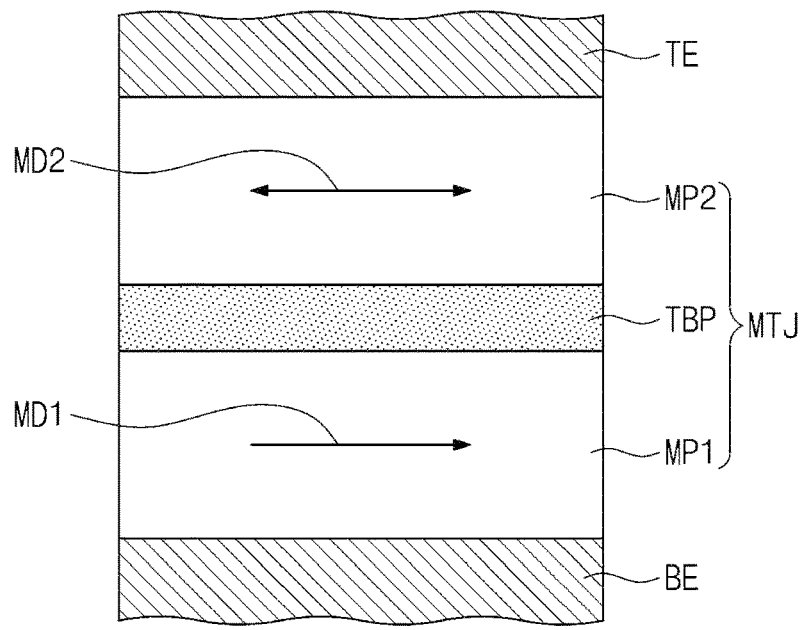

FIG. 2 is a plan view illustrating a semiconductor device according to an embodiment of the inventive concept. FIG. 3 is a sectional view taken along lines I-I' and II-II' of FIG. 2, and FIG. 4 is a sectional view taken along lines III-III' and IV-IV' of FIG. 2. FIGS. 5A and 5B are sectional views illustrating two different examples of a magnetic tunnel junction pattern of a semiconductor device according to an embodiment of the inventive concept.

Referring to FIGS. 2 to 4, a substrate 100 including a first region R1 and a second region R2 may be provided. The substrate 100 may be a semiconductor substrate, which is formed of or includes at least one of silicon (Si), silicon germanium (SiGe), germanium (Ge), or gallium arsenide (GaAs), or may be a silicon-on-insulator (SOI) wafer. The first region R1 may be a region of the substrate 100 on which memory cells are provided, and the second region R2 may be another region of the substrate 100 on which logic circuits are provided.

Interconnection structures 102 and 104 may be disposed on the first and second regions R1 and R2 of the substrate 100. The interconnection structures 102 and 104 may include interconnection lines 102, which are vertically spaced apart from the substrate 100, and interconnection contacts 104, which are connected to the interconnection lines 102. The interconnection lines 102 may be spaced apart from the top surface 100U of the substrate 100 in a direction perpendicular to a top surface 100U of the substrate 100. The interconnection contacts 104 may be disposed between the substrate 100 and the interconnection lines 102, and each of the interconnection lines 102 may be electrically connected to the substrate 100 through a corresponding one of the interconnection contacts 104. The interconnection lines 102 and the interconnection contacts 104 may be formed of or include at least one of various metallic materials (e.g., copper).

Selection elements SE (FIG. 1) may be disposed in the substrate 100. As an example, the selection elements SE may be field effect transistors. Each of the interconnection lines 102 may be electrically connected to a terminal of a corresponding one of the selection elements SE through a corresponding one of the interconnection contacts 104.

An interconnection insulating layer 110 may be disposed on the first and second regions R1 and R2 of the substrate 100 to cover the interconnection structures 102 and 104. The interconnection insulating layer 110 may be provided to expose top surfaces of the uppermost ones of the interconnection lines 102. As an example, a top surface of the interconnection insulating layer 110 may be substantially coplanar with the top surfaces of the uppermost interconnection lines 102. The interconnection insulating layer 110 may be formed of or include at least one of, for example, oxide, nitride, and/or oxynitride.

A contact insulating layer 120 may be disposed on the interconnection insulating layer 110 to cover the exposed top surfaces of the uppermost interconnection lines 102. The contact insulating layer 120 may be disposed on the interconnection insulating layer 110 on the first region R1 and may extend onto the interconnection insulating layer 110 on the second region R2. The contact insulating layer 120 may be formed of or include at least one of, for example, oxide, nitride, and/or oxynitride.

A lower contact plug 125 may be disposed on the first region R1 of the substrate 100. In an embodiment, a plurality of the lower contact plugs 125 may be provided to be spaced apart from each other in a first direction D1 and a second direction D2, which are parallel to the top surface 100U of the substrate 100. The first and second directions D1 and D2 may cross each other. Each of the lower contact plugs 125 may be provided to penetrate the contact insulating layer 120 and may be connected to a corresponding one of the interconnection lines 102. The lower contact plug 125 may be formed of or include at least one of doped semiconductor materials (e.g., doped silicon), metallic materials (e.g., tungsten, titanium, and/or tantalum), metal-semiconductor compounds (e.g., metal silicide), and conductive metal nitrides (e.g., titanium nitride, tantalum nitride, and/or tungsten nitride).

A data storage pattern DS may be disposed on the first region R1 of the substrate 100. In an embodiment, a plurality of the data storage patterns DS may be provided to be spaced apart from each other in the first and second directions D1 and D2. The data storage patterns DS may be disposed on and connected to the lower contact plugs 125, respectively.

Each data storage pattern DS may include a bottom electrode BE, a magnetic tunnel junction pattern MTJ, and a top electrode TE, which are sequentially stacked on the lower contact plug 125. The bottom electrode BE, the magnetic tunnel junction pattern MTJ, and the top electrode TE may be sequentially stacked in a third direction D3, which is perpendicular to the top surface 100U of the substrate 100. The bottom electrode BE may be disposed between the lower contact plug 125 and the magnetic tunnel junction pattern MTJ, and the magnetic tunnel junction pattern MTJ may be disposed between the bottom electrode BE and the top electrode TE. The magnetic tunnel junction pattern MTJ may include a first magnetic pattern MP1, a second magnetic pattern MP2, and a tunnel barrier pattern TBP therebetween. The first magnetic pattern MP1 may be disposed between the bottom electrode BE and the tunnel barrier pattern TBP, and the second magnetic pattern MP2 may be disposed between the top electrode TE and the tunnel barrier pattern TBP. The bottom electrode BE may be formed of or include at least one of, for example, conductive metal nitrides (e.g., titanium nitride or tantalum nitride). The top electrode TE may be formed of or include at least one of various metallic materials (e.g., tantalum (Ta), tungsten (W), ruthenium (Ru), or iridium (Ir)) or conductive metal nitrides (e.g., titanium nitride (TiN)).

Referring to FIGS. 5A and 5B, the first magnetic pattern MP1 may be a reference layer whose magnetization direction MD1 is fixed to a specific direction and the second magnetic pattern MP2 may be a free layer whose magnetization direction MD2 can be changed to be parallel or antiparallel to the magnetization direction MD1 of the first magnetic pattern MP1. FIGS. 5A and 5B illustrate an example, in which the second magnetic pattern MP2 is used as the free layer, but the inventive concept is not limited to this example. Unlike that shown in FIGS. 5A and 5B, the first magnetic pattern MP1 may be a free layer, and the second magnetic pattern MP2 may be a reference layer.

In an embodiment, as shown in FIG. 5A, the magnetization directions MD1 and MD2 of the first and second magnetic patterns MP1 and MP2 may be perpendicular to the interface between the tunnel barrier pattern TBP and the second magnetic pattern MP2. In this case, each of the first and second magnetic patterns MP1 and MP2 may be formed of or include at least one of intrinsic and extrinsic perpendicular magnetic materials. The intrinsic perpendicular magnetic material may include a material exhibiting a perpendicular magnetization property, even when there is no external cause. The intrinsic perpendicular magnetic material may include at least one of i) perpendicular magnetic materials (e.g., cobalt-iron-terbium (CoFeTb), cobalt-iron-gadolinium (CoFeGd), and cobalt-iron-dysprosium (CoFeDy)), ii) perpendicular magnetic materials with $L1_0$ structure, iii) cobalt platinum (CoPt)-based materials with hexagonal-close-packed structure, or iv) perpendicular magnetic structures. The perpendicular magnetic material with the $L1_0$ structure may include at least one of $L1_0$ FePt, $L1_0$ iron-palladium (FePd), $L1_0$ CoPd, or $L1_0$ CoPt. The perpendicular magnetic structures may include magnetic and non-magnetic layers that are alternatingly and repeatedly stacked. As an example, the perpendicular magnetic structure may include at least one of (Co/Pt)n, (CoFe/Pt)n, (CoFe/Pd)n, (Co/Pd)n, (Co/nickel (Ni))n, (CoNi/Pt)n, (cobalt-chromium (CoCr)/Pt)n, or (CoCr/Pd)n, where "n" is a natural number equal to or greater than 2. The extrinsic perpendicular magnetic material may include a material that exhibits an intrinsic in-plane magnetization property when there is no external cause but exhibits a perpendicular magnetization property by an external cause. For example, due to a magnetic anisotropy, which results from interfacial characteristics between the first or second magnetic pattern MP1 or MP2 and the tunnel barrier pattern TBP, the extrinsic perpendicular magnetic material may have the perpendicular magnetization property. The extrinsic perpendicular magnetic material may be formed of or include, for example, cobalt-iron-boron (CoFeB).

As another example, as shown in FIG. 5B, the magnetization directions MD1 and MD2 of the first and second magnetic patterns MP1 and MP2 may be parallel to the interface between the tunnel barrier pattern TBP and the second magnetic pattern MP2. In this case, each of the first and second magnetic patterns MP1 and MP2 may be formed of or include a ferromagnetic material. The first magnetic pattern MP1 may further include an anti-ferromagnetic material, which is provided in the first magnetic pattern MP1 and is used to fix a magnetization direction of the ferromagnetic material.

Each of the first and second magnetic patterns MP1 and MP2 may be formed of or include at least one of Co-based Heusler alloys. The tunnel barrier pattern TBP may include at least one of, for example, magnesium oxide, titanium oxide, aluminum oxide, magnesium-zinc oxide, or magnesium-boron oxide.

Referring again to FIGS. 2 to 4, the contact insulating layer 120 on the first region R1 may have a top surface 120RU, which is located between the data storage patterns DS and is recessed (e.g., concavely curved) toward the substrate 100. The recessed top surface 120RU of the contact insulating layer 120 may be located at a height lower than a top surface 125U of the lower contact plug 125. In the present specification, the term 'height' may be used to represent a distance from the top surface 100U of the substrate 100, which is measured in the third direction D3. A top surface 120U of the contact insulating layer 120 on the second region R2 may be located at a height, which is lower than or equal to the recessed top surface 120RU of the contact insulating layer 120 on the first region R1.

A protection insulating layer 130 may be disposed on the first region R1 of the substrate 100 and may cover a side surface of the data storage pattern DS. The protection insulating layer 130 may surround the side surface of the data storage pattern DS, when viewed in a plan view. The protection insulating layer 130 may cover side surfaces of the bottom electrode BE, the magnetic tunnel junction pattern MTJ, and the top electrode TE and may surround the side surfaces of the bottom electrode BE, the magnetic tunnel junction pattern MTJ, and the top electrode TE, when viewed in a plan view. The protection insulating layer 130 may conformally cover the recessed top surface 120RU of the contact insulating layer 120 on the first region R1. The protection insulating layer 130 may be formed of or include at least one of various nitrides (e.g., silicon nitride).

A first lower insulating layer 132 may be disposed on the first region R1 of the substrate 100 and may fill a space between the data storage patterns DS. The protection insulating layer 130 may be interposed between the side surface of each of the data storage patterns DS and the first lower insulating layer 132 and may extend into a region between the recessed top surface 120RU of the contact insulating layer 120 and the first lower insulating layer 132. The first lower insulating layer 132 may be formed of or include at least one of oxide, nitride, and/or oxynitride.

A second lower insulating layer 134 may be disposed on the second region R2 of the substrate 100 and may cover the top surface 120U of the contact insulating layer 120. On the second region R2, the protection insulating layer 130 may not be interposed between the top surface 120U of the contact insulating layer 120 and the second lower insulating layer 134, and thus, the second lower insulating layer 134 may be in direct contact with the top surface 120U of the contact insulating layer 120. The second lower insulating layer 134 may be formed of or include a material that is different from the first lower insulating layer 132. The second lower insulating layer 134 may be formed of or include at least one of oxide, nitride, and/or oxynitride and may have a dielectric constant that is lower than that of the first lower insulating layer 132.

Lower connection structures 136 and 138 may be disposed on the second region R2 of the substrate 100. The lower connection structures 136 and 138 may penetrate the second lower insulating layer 134 and the contact insulating layer 120 and may be connected to a corresponding one of the interconnection lines 102. At least a portion of the lower connection structures 136 and 138 may be horizontally overlapped with at least a portion of the data storage pattern DS. For example, the at least a portion of the lower connection structures 136 and 138 may be located at the same height as the at least a portion of the data storage pattern DS, when measured from (i.e., relative to) the substrate 100. The second lower insulating layer 134 may cover side surfaces of the lower connection structures 136 and 138.

The lower connection structures 136 and 138 may include a lower conductive line 138 and a lower conductive contact 136, which extends from a bottom surface of the lower conductive line 138 toward the substrate 100. The lower conductive line 138 may be disposed in the second lower insulating layer 134, and the second lower insulating layer 134 may be provided to expose a top surface of the lower conductive line 138. A top surface of the second lower insulating layer 134 may be coplanar with the top surface of the lower conductive line 138. At least a portion of the lower conductive line 138 may be located at the same height as at least a portion of the data storage pattern DS, when measured from the substrate 100. The lower conductive contact 136 may be disposed between the lower conductive line 138 and the corresponding interconnection line 102 to penetrate a portion of the second lower insulating layer 134 and the contact insulating layer 120 and may be connected to the corresponding interconnection line 102. The lower conductive line 138 may be connected to the corresponding interconnection line 102 through the lower conductive contact 136. The lower conductive line 138 and the lower conductive contact 136 may be formed of or include at least one of metallic materials (e.g., copper).

An insulating layer 140 may be disposed on the first lower insulating layer 132 on the first region R1 and may extend onto the second lower insulating layer 134 on the second region R2. The insulating layer 140 may cover the exposed top surface of the lower conductive line 138 on the second region R2. The insulating layer 140 may be formed of or include nitride (e.g., silicon carbonitride (SiCN)).

An upper insulating layer 150 may be disposed on the first region R1 of the substrate 100 and may extend onto the second region R2 of the substrate 100. The insulating layer 140 may be interposed between the first lower insulating layer 132 and the upper insulating layer 150 and between the second lower insulating layer 134 and the upper insulating layer 150. In an embodiment, the upper insulating layer 150 may be formed of or include at least one of oxide, nitride, and/or oxynitride.

A cell line structure 190 may be disposed on the first region R1 of the substrate 100. The cell line structure 190 may penetrate the upper insulating layer 150 and the insulating layer 140 on the first region R1 and may be connected (e.g., electrically connected) to the data storage pattern DS. The cell line structure 190 may extend longitudinally in the first direction D1 and may be connected to ones of the data storage patterns DS, which are arranged in the first direction D1. In an embodiment, a plurality of the cell line structures 190 may be provided. The cell line structures 190 may extend in the first direction D1 and may be spaced apart from each other in the second direction D2. Each of the cell line structures 190 may be connected to ones of the data storage patterns DS, which are arranged in the first direction D1.

A bottom surface 190L of the cell line structure 190 may be in direct contact with a top surface DS_U of the data storage pattern DS. The top surface DS_U of the data storage pattern DS may correspond to (e.g., may be) a top surface of the top electrode TE of the data storage pattern DS. In other words, the bottom surface 190L of the cell line structure 190 may be in direct contact with the top electrode TE. A side surface 190S of the cell line structure 190 may extend from the bottom surface 190L of the cell line structure 190 and may have a straight line shape, when viewed in a sectional view. In a region from the bottom surface 190L of the cell line structure 190 to a top surface 190U of the cell line structure 190, the side surface 190S of the cell line structure 190 may have a continuously extended straight line shape, when viewed in a sectional view. The entirety of the side surface 190S of the cell line structure 190 may have the straight line shape and may not have any bent or stepped shape, when viewed in the sectional view. An angle 190A between the side and bottom surfaces 190S and 190L of the cell line structure 190 may be a right or obtuse angle. For example, the angle 190A may be a right angle, and the cell line structure 190 may have another side surface that is opposite and parallel to the side surface 190S.

The cell line structure 190 may include a cell conductive line 194, which extends in the first direction D1, and a cell barrier pattern 192, which extends along bottom and side surfaces of the cell conductive line 194. The cell conductive line 194 may be a single line-shaped pattern that extends longitudinally in the first direction D1. The cell barrier pattern 192 may extend along the bottom and side surfaces of the cell conductive line 194. The cell barrier pattern 192 may be interposed between the bottom surface of the cell conductive line 194 and the top surface DS_U of the data storage pattern DS and may be in direct contact with the top surface DS_U of the data storage pattern DS. The cell barrier pattern 192 may be in direct contact with the top electrode TE of the data storage pattern DS. The cell conductive line 194 may be formed of or include at least one of various metallic materials (e.g., copper), and the cell barrier pattern 192 may be formed of or include at least one of various conductive metal nitrides.

An upper connection structure 200 may be disposed on the second region R2 of the substrate 100. The upper connection structure 200 may penetrate the upper insulating layer 150 and the insulating layer 140 on the second region R2 and may be connected to the lower conductive line 138. The upper connection structure 200 may include an upper conductive line 204, which is elongated in the first direction D1, and upper conductive contacts 206, which are spaced apart from each other along a bottom surface 204L of the upper conductive line 204 or in the first direction D1. Each of the upper conductive contacts 206 may extend from the bottom surface 204L of the upper conductive line 204 toward the substrate 100. The upper conductive line 204 may penetrate an upper portion of the upper insulating layer 150, and the bottom surface 204L of the upper conductive line 204 may be located in the upper insulating layer 150, when viewed in a sectional view. Each of the upper conductive contacts 206 may penetrate a lower portion of the upper insulating layer 150 and the insulating layer 140 and may be connected (e.g., electrically connected) to the lower conductive line 138. In other words, the lower conductive line 138 may be connected to a corresponding one of the upper conductive contacts 206. The bottom surface 204L of the upper conductive line 204 may be located at a height that is higher than the bottom surface 190L of the cell line structure 190 and is lower than the top surface 190U of the cell line structure 190, when measured from the substrate 100. The upper conductive line 204 and the upper conductive contacts 206 may be formed of or include the same material and may be in contact with each other without any interface (e.g., without any demarcation) therebetween, and in this case, the upper conductive line 204 and the upper conductive contacts 206 may constitute a single object.

The upper connection structure 200 may further include an upper barrier pattern 202, which extends along the side surface and the bottom surface 204L of the upper conductive line 204. The upper barrier pattern 202 may extend from the bottom surface 204L of the upper conductive line 204 to regions on the side and bottom surfaces of each of the upper conductive contacts 206.

The upper conductive line 204 and the upper conductive contacts 206 may be formed of or include the same material as the cell conductive line 194 of the cell line structure 190. As an example, the upper conductive line 204 and the upper conductive contacts 206 may be formed of or include at least one of various metallic materials (e.g., copper). The upper barrier pattern 202 may be formed of or include the same material as the cell barrier pattern 192 of the cell line structure 190. As an example, the upper barrier pattern 202 may be formed of or include at least one of various conductive metal nitrides.

In the case where the cell line structure 190 has a line shape extending in the first direction D1 and the upper connection structure 200 includes the upper conductive line 204, which extends in the first direction D1, and the upper conductive contacts 206, which are arranged along the bottom surface 204L of the upper conductive line 204 to be spaced apart from each other in the first direction D1, a fabrication process for simultaneously forming the cell line structure 190 and the upper connection structure 200 having different shapes from each other may suffer from a large process difficulty and a small process margin. In this case, a profile failure, such as a bent or stepped shape, may occur on the side surface 190S of the cell line structure 190, and this may lead to a pattern failure in the cell line structure 190.

According to an embodiment of the inventive concept, the cell line structure 190 may be a line-shape structure that extends in the first direction D1, and in particular, the side surface 190S of the cell line structure 190 may be formed to have a straight line shape continuously-extending between the bottom and top surfaces 190L and 190U of the cell line structure 190. In addition, the upper connection structure 200 may be formed such that the bottom surface 204L of the upper conductive line 204 is located at a height (i.e., a vertical level) between respective heights (i.e., vertical levels) of the bottom and top surfaces 190L and 190U of the cell line structure 190. The cell line structure 190 and the upper connection structure 200, which have different shapes from each other, may be formed at the same time. During the process of simultaneously forming the cell line structure 190 and the upper connection structure 200, the side surface 190S of the cell line structure 190 may be formed to have a straight line shape. Accordingly, it may be possible to inhibit/prevent a pattern failure from occurring in the cell line structure 190 and thereby to realize a highly reliable semiconductor device.

FIGS. 6, 9, 12, and 15 are plan views illustrating a method of fabricating a semiconductor device according to an embodiment of the inventive concept. FIGS. 7, 10, 13, and 16 are sectional views taken along lines I-I' and II-II' of FIGS. 6, 9, 12, and 15, respectively, and FIGS. 8, 11, 14, and 17 are sectional views taken along lines III-III' and IV-IV of FIGS. 6, 9, 12, and 15, respectively. For the sake of brevity, an element previously described with reference to FIGS. 1 to 5B may be identified by the same reference number without repeating an overlapping description thereof.

Figure 6:
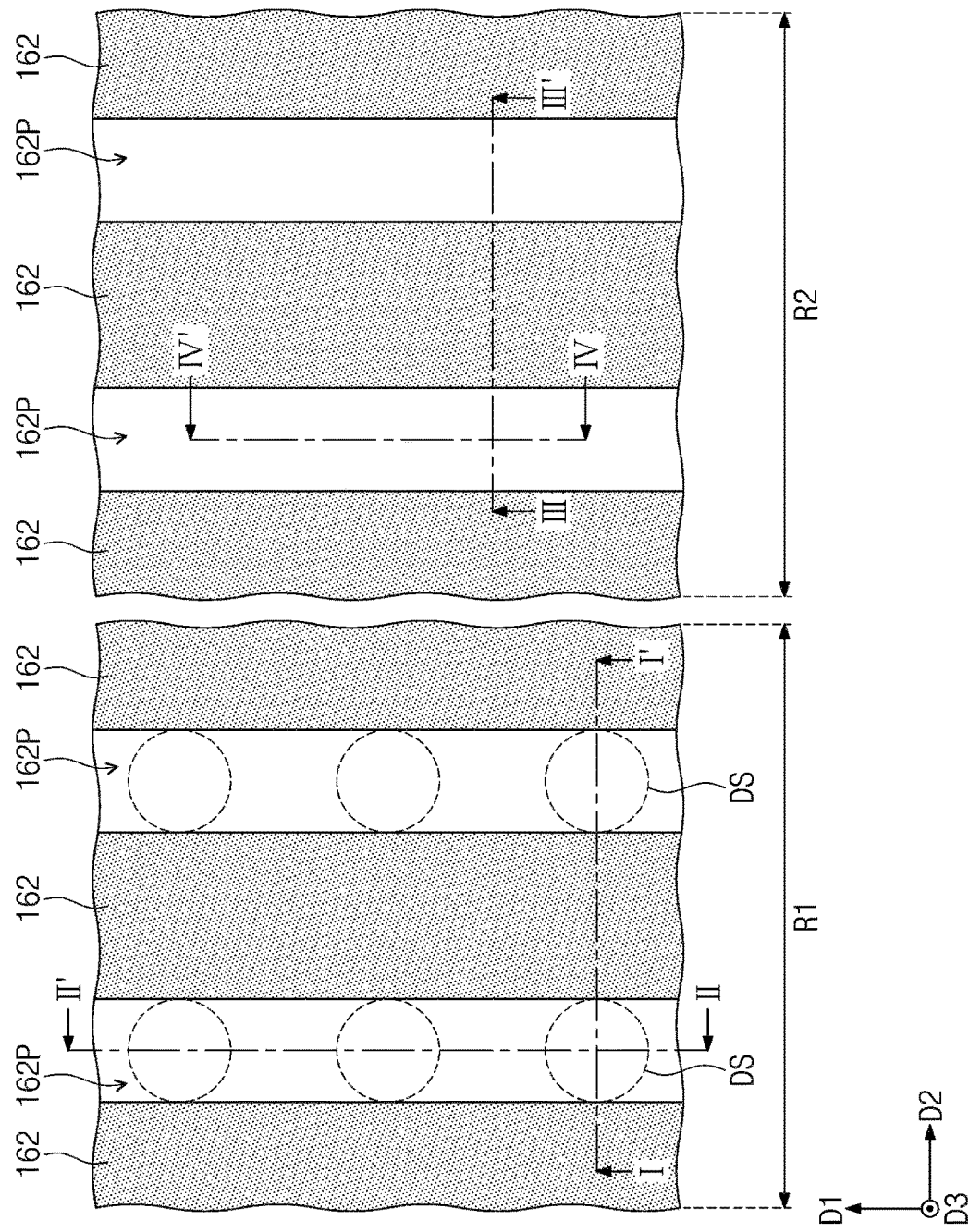
FIGS. 6, 9, 12, and 15 are plan views illustrating a method of fabricating a semiconductor device according to an embodiment of the inventive concept.
Figure 7:
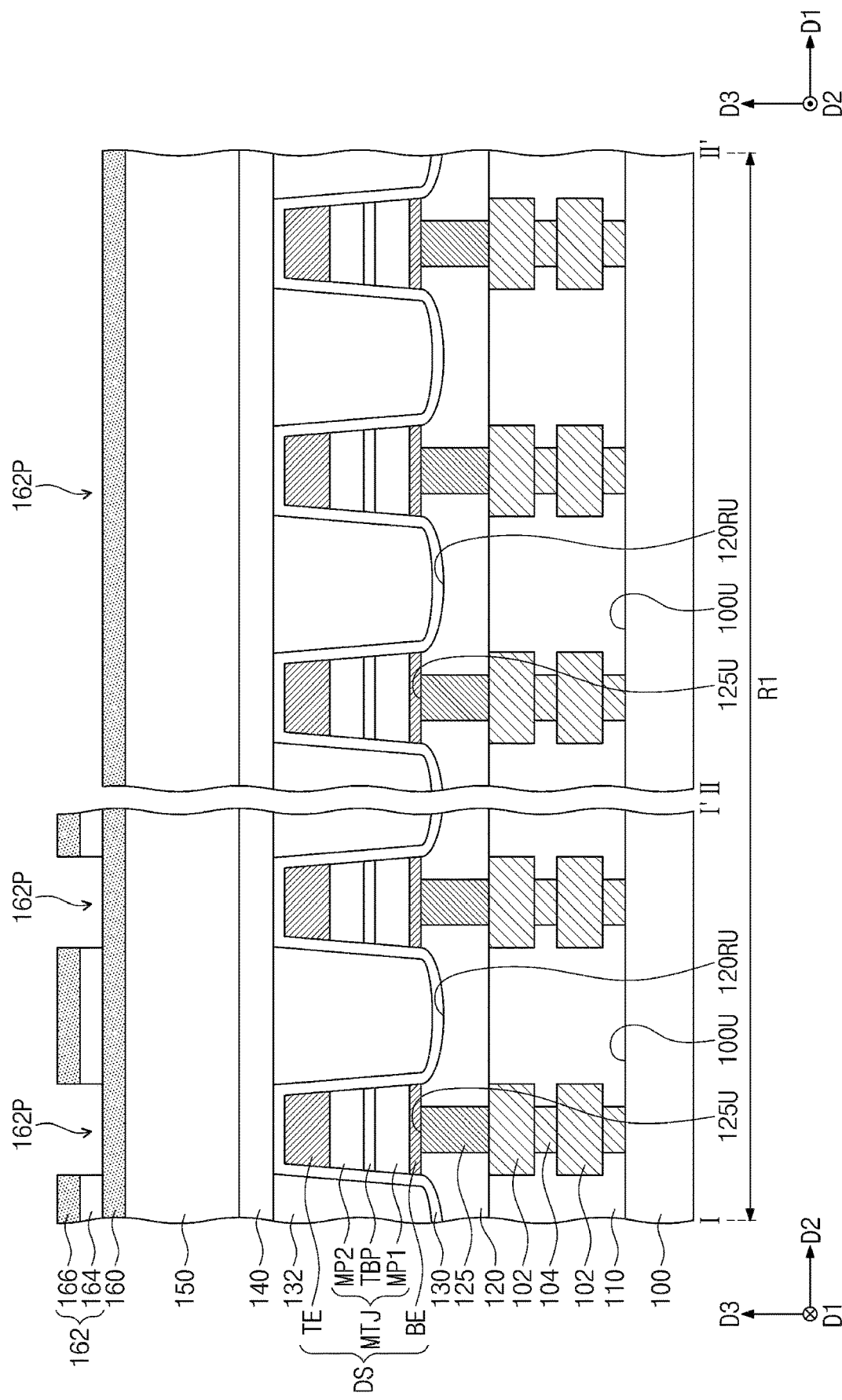
FIGS. 7, 10, 13, and 16 are sectional views taken along lines I-I' and II-II' of FIGS. 6, 9, 12, and 15, respectively.
Figure 8:
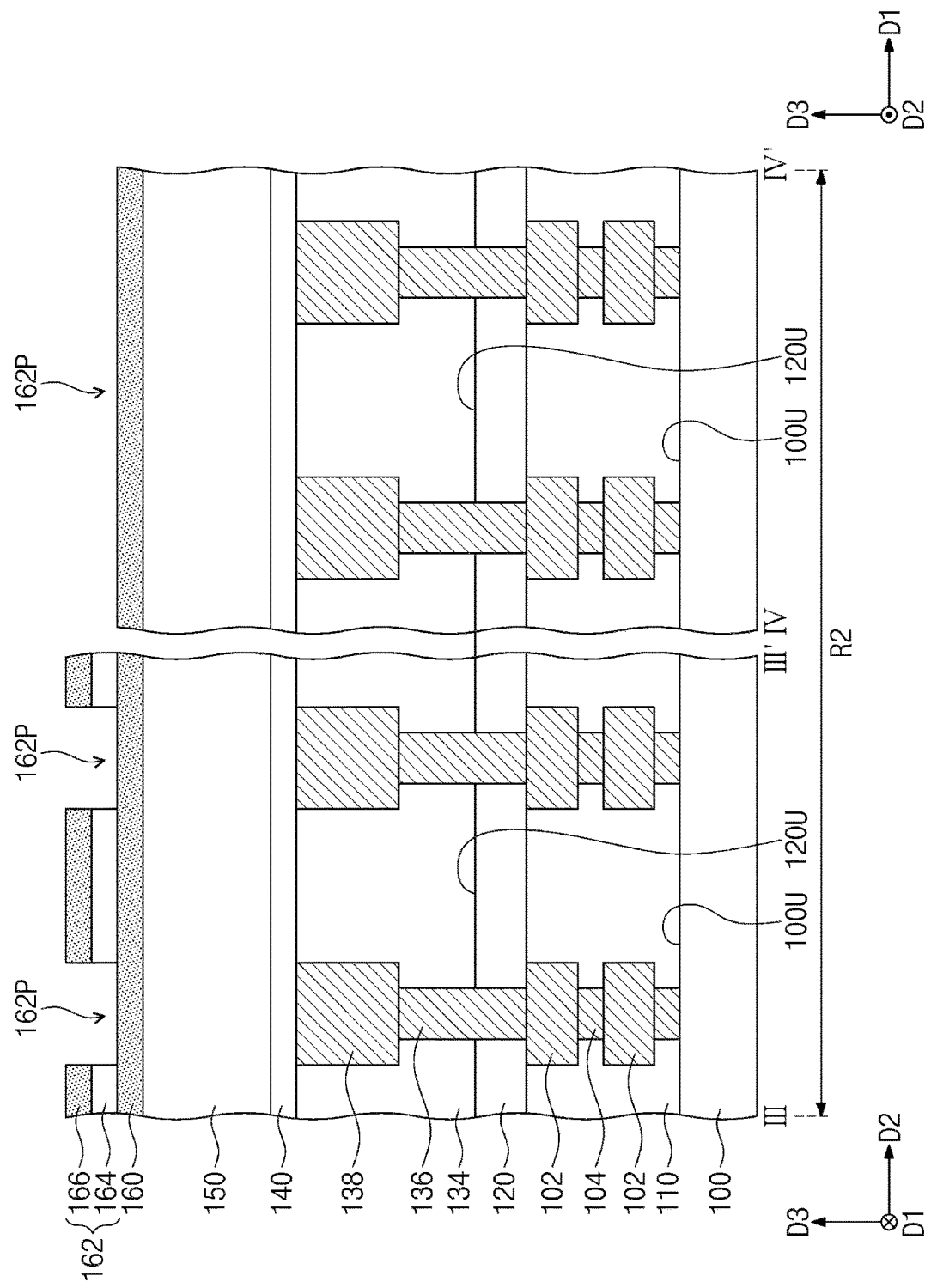
FIGS. 8, 11, 14, and 17 are sectional views taken along lines III-III' and IV-IV' of FIGS. 6, 9, 12, and 15, respectively.

Referring to FIGS. 6 to 8, a substrate 100 including a first region R1 and a second region R2 may be provided. Selection elements SE (FIG. 1) may be formed in the substrate 100, and interconnection structures 102 and 104 may be formed on the first and second regions R1 and R2 of the substrate 100. The interconnection structures 102 and 104 may include interconnection lines 102 and interconnection contacts 104, which are connected to the interconnection lines 102. Each of the interconnection lines 102 may be electrically connected to a terminal of a corresponding one of the selection elements SE through a corresponding one of the interconnection contacts 104. An interconnection insulating layer 110 may be formed on the first and second regions R1 and R2 of the substrate 100 and may cover the interconnection structures 102 and 104. The interconnection insulating layer 110 may be formed to expose top surfaces of the uppermost ones of the interconnection lines 102.

A contact insulating layer 120 may be formed on the first and second regions R1 and R2 of the substrate 100. The contact insulating layer 120 may be formed on the interconnection insulating layer 110 and may cover the exposed top surfaces of the uppermost interconnection lines 102.

A lower contact plug 125 may be formed on the first region R1 of the substrate 100. The lower contact plug 125 may be provided to penetrate the contact insulating layer 120 and may be connected to a corresponding one of the interconnection lines 102. In an embodiment, the formation of the lower contact plug 125 may include forming a lower contact hole to penetrate the contact insulating layer 120, forming a lower contact layer on the contact insulating layer 120 to fill the lower contact hole, and planarizing the lower contact layer to expose the top surface of the contact insulating layer 120. As a result of the planarization process, the lower contact plug 125 may be locally formed in the lower contact hole. Here, a top surface 125U of the lower contact plug 125 may not be covered with the contact insulating layer 120 and may be exposed to the outside.

A data storage pattern DS may be formed on the first region R1 of the substrate 100. The data storage pattern DS may include a bottom electrode BE, a magnetic tunnel junction pattern MTJ, and a top electrode TE, which are sequentially stacked on the lower contact plug 125 in a direction perpendicular to a top surface 100U of the substrate 100 (e.g., a third direction D3). The magnetic tunnel junction pattern MTJ may include a first magnetic pattern MP1, a second magnetic pattern MP2, and a tunnel barrier pattern TBP therebetween. In an embodiment, the formation of the data storage pattern DS may include sequentially forming a bottom electrode layer and a magnetic tunnel junction layer on the contact insulating layer 120, forming a conductive mask pattern on the magnetic tunnel junction layer, and sequentially etching the magnetic tunnel junction layer and the bottom electrode layer using the conductive mask pattern as an etch mask. The magnetic tunnel junction layer may include a first magnetic layer, a tunnel barrier layer, and a second magnetic layer, which are sequentially stacked on the bottom electrode layer. The magnetic tunnel junction layer and the bottom electrode layer may be formed by, for example, a sputtering process, a chemical vapor deposition process, or an atomic layer deposition process.

The magnetic tunnel junction pattern MTJ and the bottom electrode BE may be respectively formed by the etching of the magnetic tunnel junction layer and the bottom electrode layer. The etching of the magnetic tunnel junction layer may include sequentially etching the second magnetic layer, the tunnel barrier layer, and the first magnetic layer using the conductive mask pattern as an etch mask. The second magnetic pattern MP2, the tunnel barrier pattern TBP, and the first magnetic pattern MP1 may be respectively formed by the etching of the second magnetic layer, the tunnel barrier layer, and the first magnetic layer. A remaining portion of the conductive mask pattern, which is left on the magnetic tunnel junction pattern MTJ after the etching of the magnetic tunnel junction layer and the bottom electrode layer, may be used as the top electrode TE.

In an embodiment, the etching process of the magnetic tunnel junction layer and the bottom electrode layer may be an ion beam etching process using an ion beam. The ion beam may include inert or inactive ions. As a result of the etching process, an upper portion of the contact insulating layer 120 may be recessed at opposite sides of the data storage pattern DS. Accordingly, the contact insulating layer 120 on the first region R1 may have a top surface 120RU that is recessed toward the substrate 100. The recessed top surface 120RU of the contact insulating layer 120 may be located at a height lower than the top surface 125U of the lower contact plug 125. In addition, an upper portion of the contact insulating layer 120 on the second region R2 may be recessed by the etching process. Thus, a top surface 120U of the contact insulating layer 120 on the second region R2 may be located at a height that is lower than or equal to the recessed top surface 120RU of the contact insulating layer 120 on the first region R1.

A protection insulating layer 130 may be formed on the contact insulating layer 120 and may conformally cover top and side surfaces of the data storage pattern DS. The protection insulating layer 130 may conformally cover the recessed top surface 120RU of the contact insulating layer 120 on the first region R1 and may extend to a region, which is located on the top surface 120U of the contact insulating layer 120 on the second region R2.

A first lower insulating layer 132 may be formed on the protection insulating layer 130. The first lower insulating layer 132 may be formed on the protection insulating layer 130 on the first region R1 to cover the information storage pattern DS and may extend to cover the protection insulating layer 130 on the second region R2.

The first lower insulating layer 132 and the protection insulating layer 130 may be removed from the second region R2. Accordingly, the top surface 120U of the contact insulating layer 120 may be exposed on the second region R2. A second lower insulating layer 134 may be formed on the second region R2 of the substrate 100 and may cover the exposed top surface 120U of the contact insulating layer 120.

Lower connection structures 136 and 138 may be formed on the second region R2 of the substrate 100 and in the second lower insulating layer 134. The lower connection structures 136 and 138 may include a lower conductive line 138, which is provided to penetrate an upper portion of the second lower insulating layer 134, and a lower conductive contact 136, which is provided to penetrate a lower portion of the second lower insulating layer 134 and the contact insulating layer 120. In an embodiment, the formation of the lower connection structures 136 and 138 may include forming a lower trench to penetrate the upper portion of the second lower insulating layer 134, forming a lower hole to penetrate a lower portion of the second lower insulating layer 134 and the contact insulating layer 120, forming a lower conductive layer on the second lower insulating layer 134 to fill the lower trench and the lower hole, and planarizing the lower conductive layer to expose the top surface of the second lower insulating layer 134. As a result of the planarization process, the top surface of the second lower insulating layer 134 may be coplanar with the top surface of the lower conductive line 138.

The insulating layer 140 may be formed on the first lower insulating layer 132 on the first region R1 and may extend onto the second lower insulating layer 134 on the second region R2. The insulating layer 140 may cover the exposed top surface of the lower conductive line 138 on the second region R2. The upper insulating layer 150 may be formed on the first and second regions R1 and R2 of the substrate 100 and may be stacked on the insulating layer 140.

A lower layer 160 may be formed on the first and second regions R1 and R2 of the substrate 100 and may be stacked on the upper insulating layer 150. In an embodiment, the lower layer 160 may be formed of or include silicon oxynitride (SiON).

Mask patterns 162 may be formed on the lower layer 160. The mask patterns 162 on the lower layer 160 of the first region R1 may extend in the first direction D1 and may be spaced apart from each other in the second direction D2. In addition, the mask patterns 162 on the lower layer 160 of the second region R2 may extend in the first direction D1 and may be spaced apart from each other in the second direction D2. The mask patterns 162 may have a line opening 162P, which is provided between adjacent ones of the mask patterns 162. Between adjacent ones of the mask patterns 162, the line opening 162P may extend in the first direction D1. The line opening 162P on the first region R1 may vertically (e.g., in the third direction D3) overlap the data storage patterns DS, which are arranged in the first direction D1. The line opening 162P on the second region R2 may vertically overlap the lower connection structures 138 and 136 arranged in the first direction D1.

Each of the mask patterns 162 may include a first mask pattern 164 and a second mask pattern 166, which are sequentially stacked on the lower layer 160. The first mask pattern 164 may be formed of or include a material that is different from the second mask pattern 166. As an example, the first mask pattern 164 may be formed of or include at least one of various metal nitride materials (e.g., TiN). The second mask pattern 166 may be formed of or include the same material as the lower layer 160. In an embodiment, the second mask pattern 166 may be formed of or include silicon oxynitride (SiON).

Figure 9:
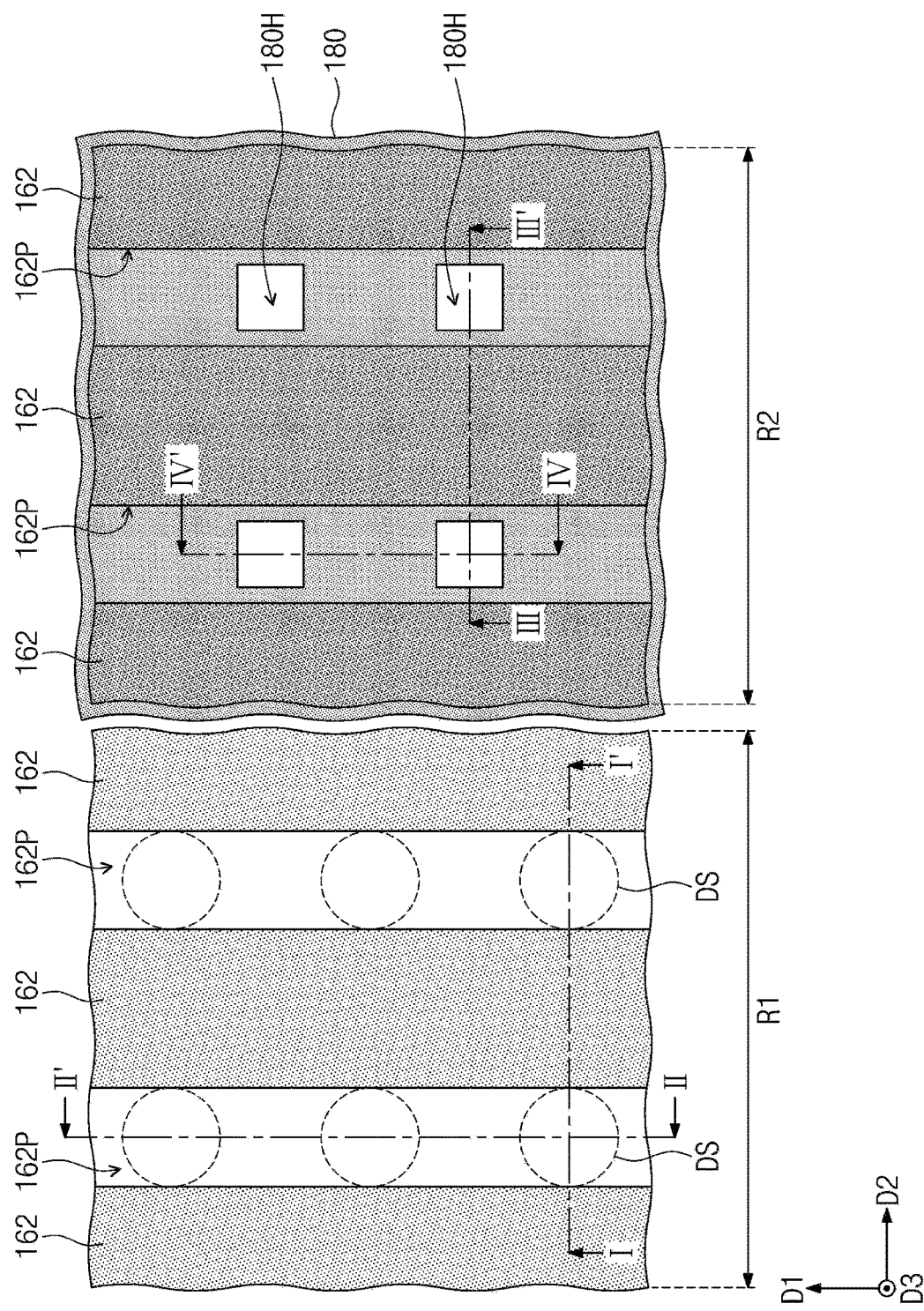
Figure 10:
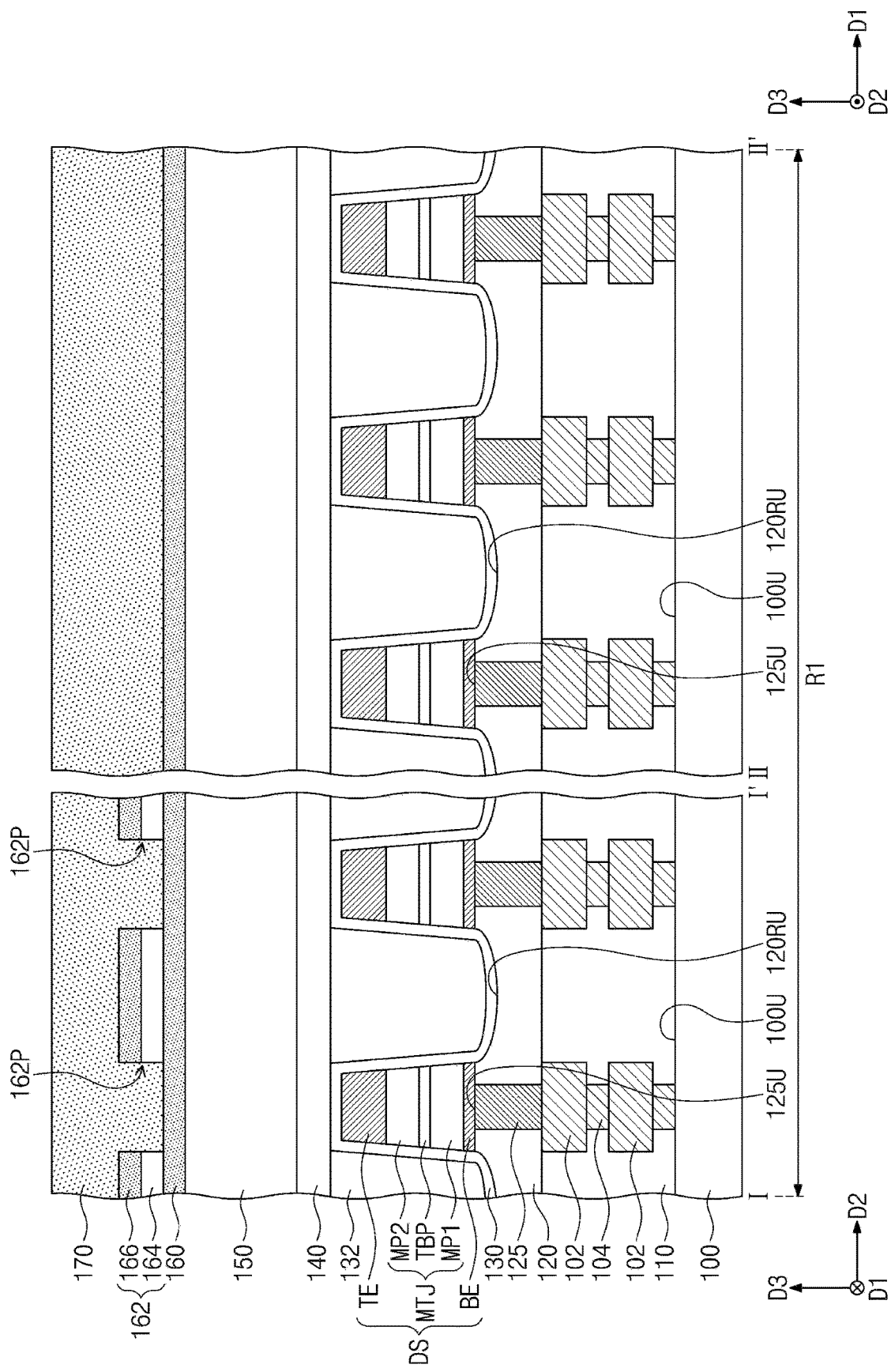
Figure 11:
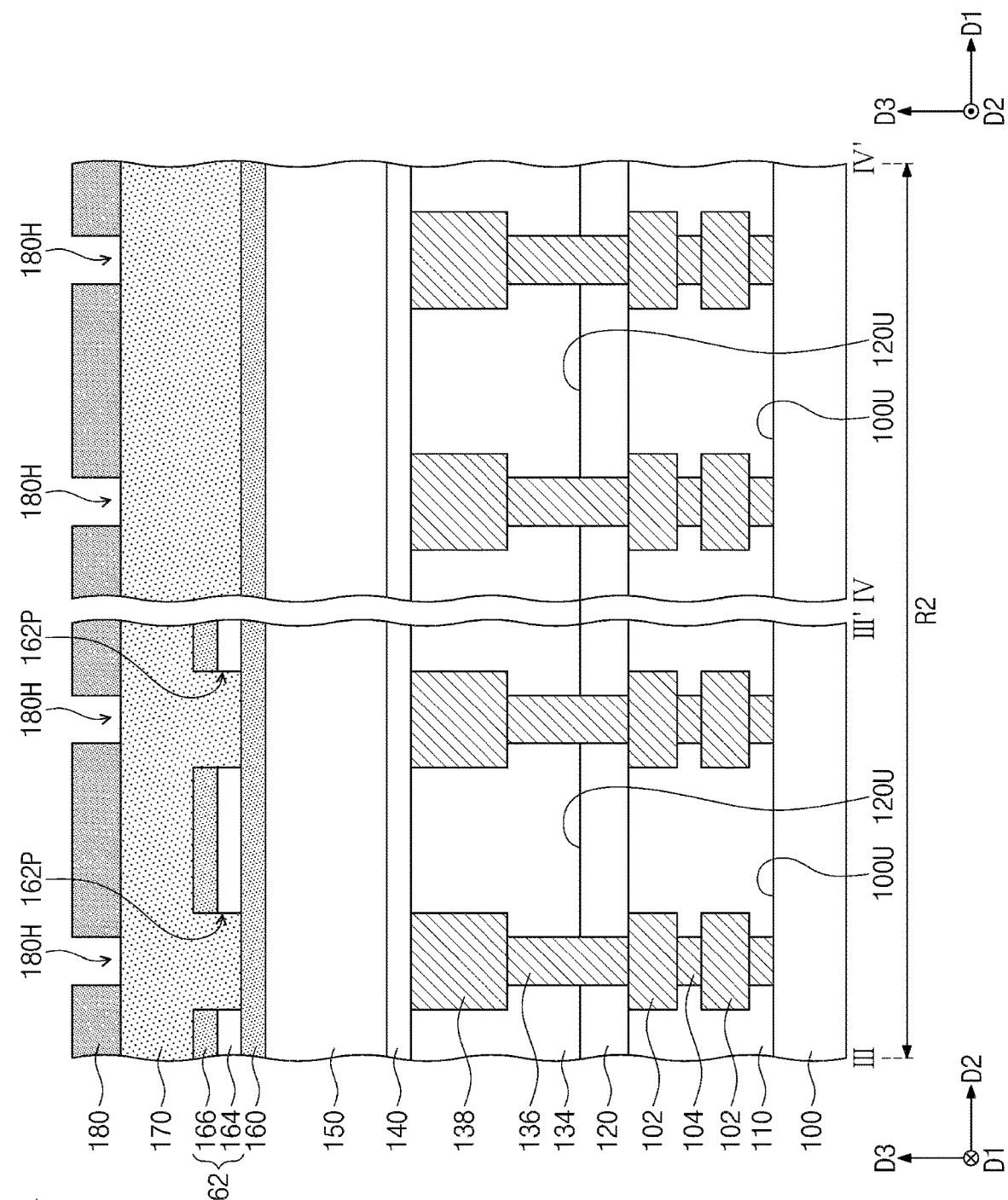

Referring to FIGS. 9 to 11, a sacrificial layer 170 may be formed on the first and second regions R1 and R2 of the substrate 100 to cover the mask patterns 162. In an embodiment, the sacrificial layer 170 may be formed of or include a spin-on-hardmask (SOH) material. The sacrificial layer 170 may fill the line opening 162P between the mask patterns 162 and may cover the lower layer 160 between the mask patterns 162.

A photoresist pattern 180 may be formed on the second region R2 of the substrate 100. The photoresist pattern 180 may be formed on the sacrificial layer 170 on the second region R2 and may expose the sacrificial layer 170 on the first region R1. The photoresist pattern 180 may have a plurality of openings 180H, which are spaced apart from each other in the first direction D1. The openings 180H may vertically (e.g., in the third direction D3) overlap the line opening 162P between the mask patterns 162 on the second region R2. The openings 180H may vertically overlap the plurality of lower connection structures 138 and 136, respectively, which are arranged in the first direction D1.

Figure 12:
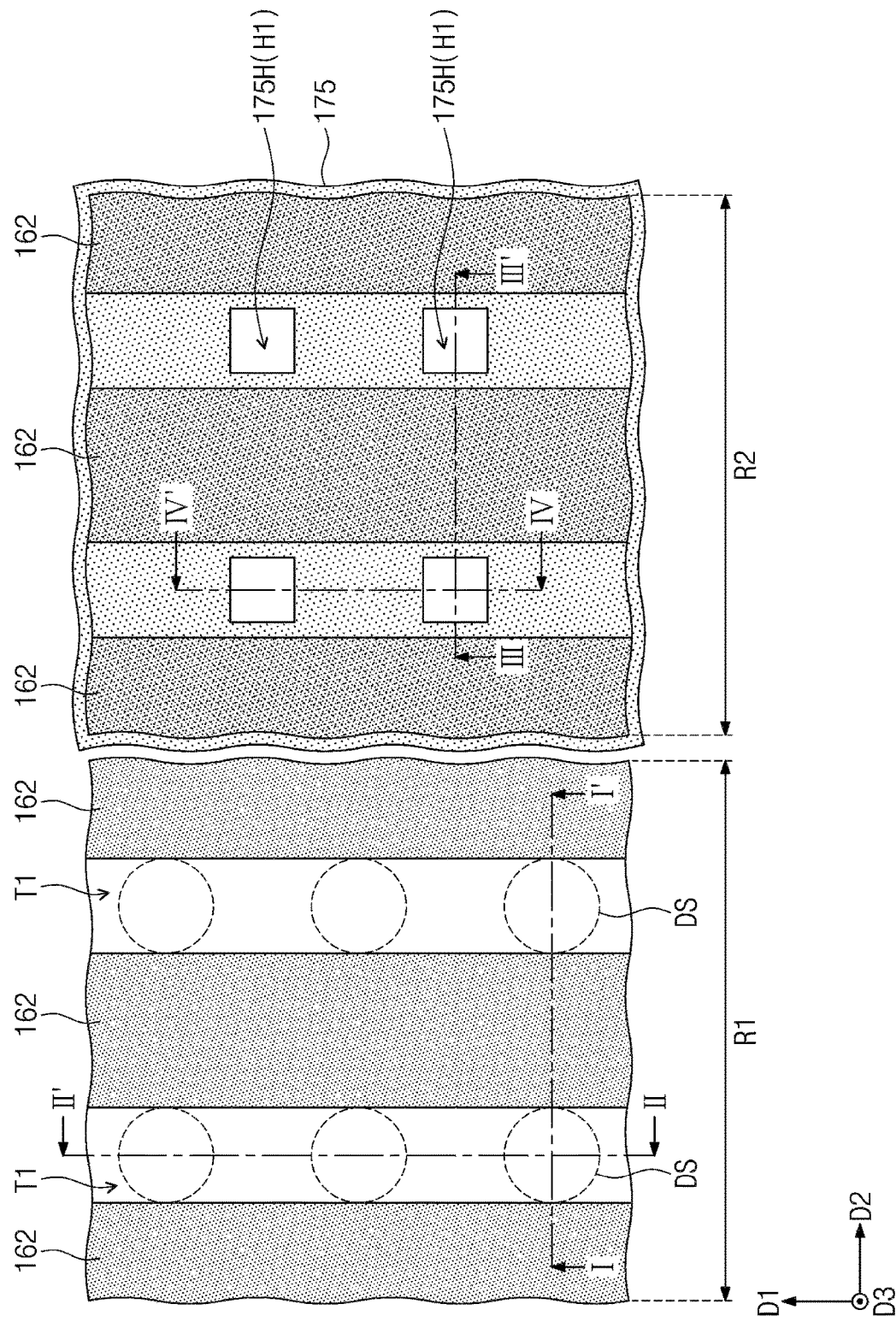
Figure 13:
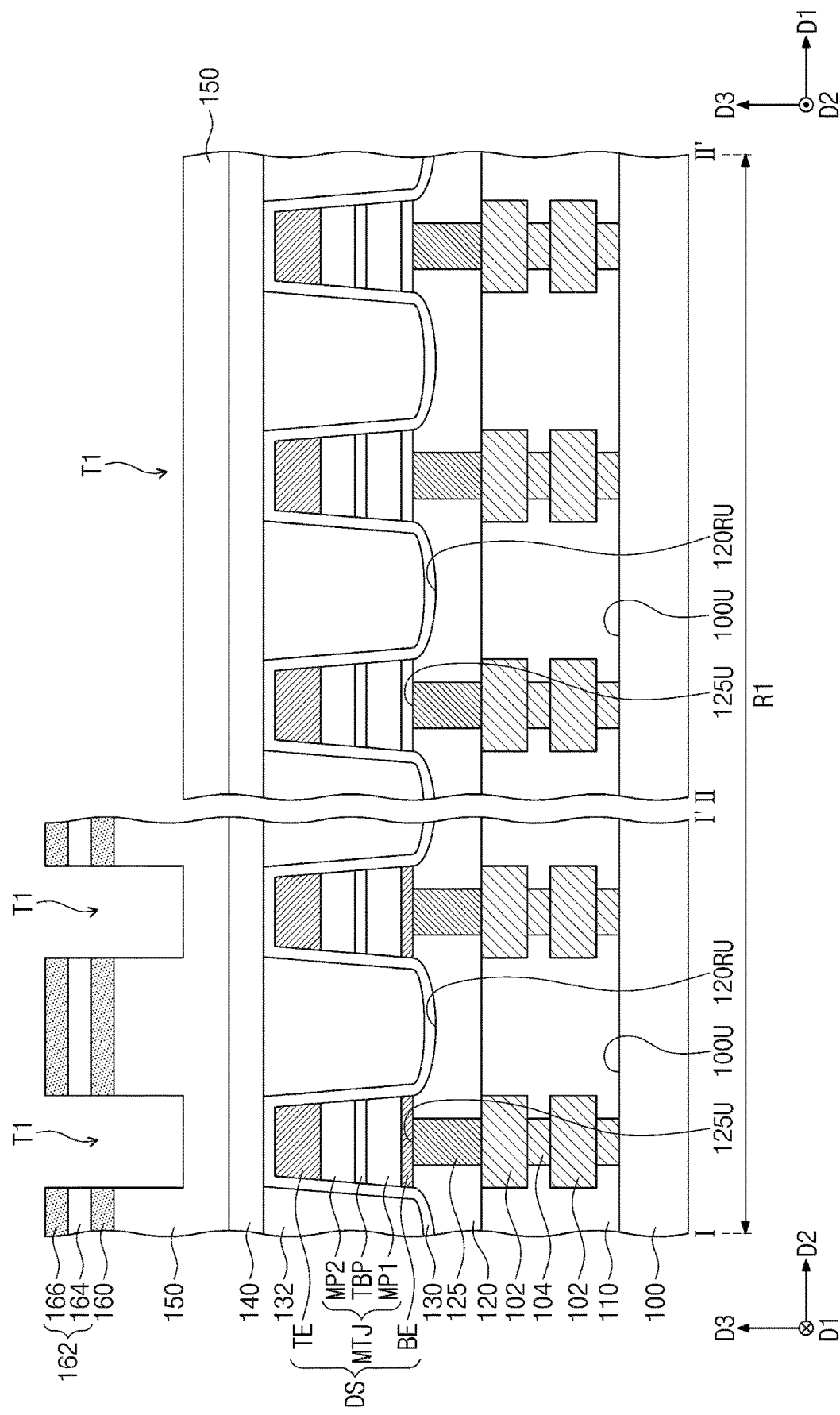
Figure 14:
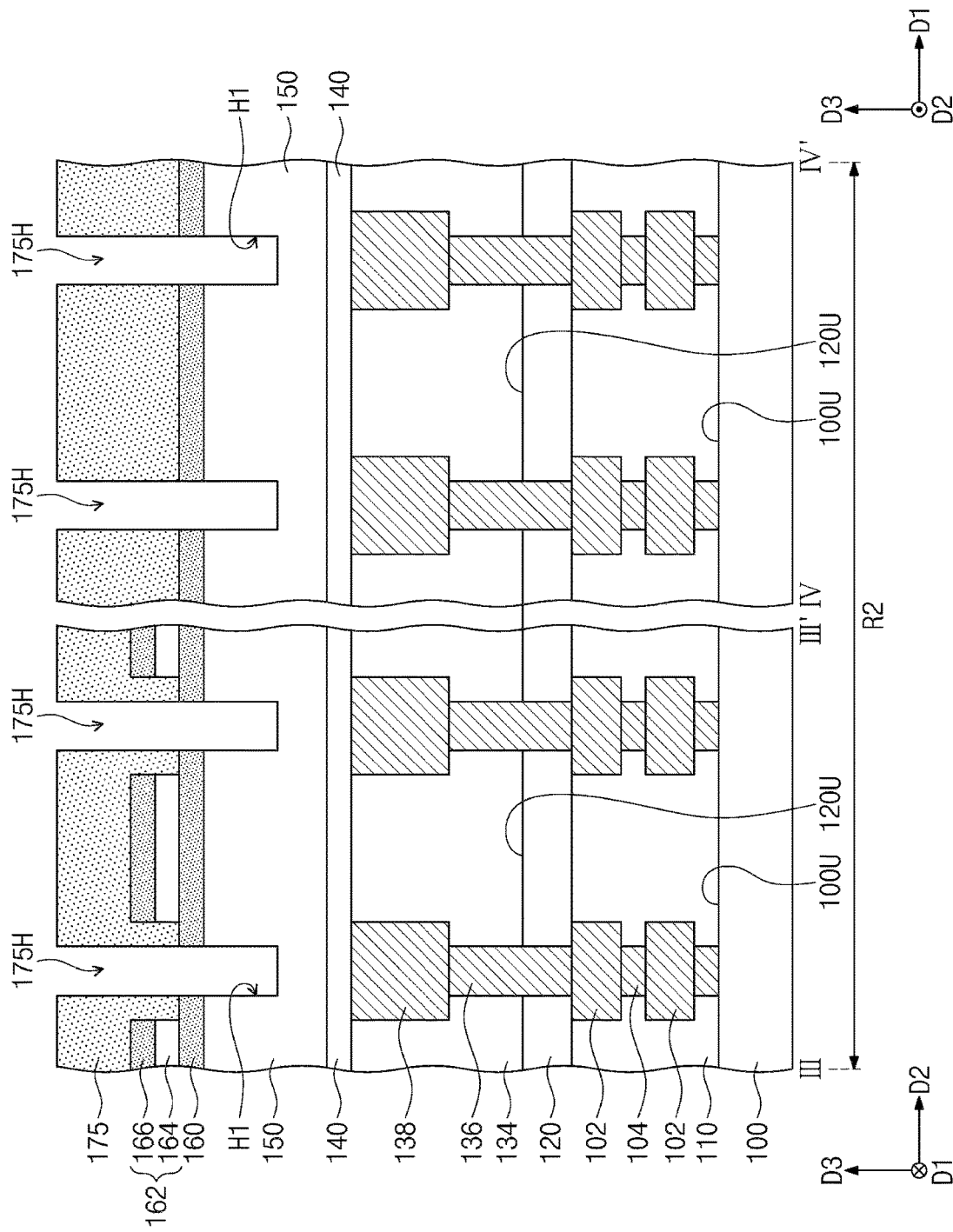

Referring to FIGS. 12 to 14, the sacrificial layer 170 on the first and second regions R1 and R2 may be etched using the photoresist pattern 180 as an etch mask. Accordingly, a sacrificial pattern 175 may be formed on the second region R2 of the substrate 100. The sacrificial pattern 175 may cover the mask patterns 162 on the second region R2 and may expose the mask patterns 162 on the first region R1. The mask patterns 162 on the first region R1 may expose the lower layer 160 therebetween. The photoresist pattern 180 may be removed after the formation of the sacrificial pattern 175. For example, the photoresist pattern 180 may be removed by an ashing and/or strip process.

The sacrificial pattern 175 may have a plurality of sacrificial openings 175H corresponding to the openings 180H of the photoresist pattern 180. The sacrificial openings 175H may be spaced apart from each other in the first direction D1, between adjacent ones of the mask patterns 162 on the second region R2. Each of the sacrificial openings 175H may expose a portion of the lower layer 160, which is located between the adjacent ones of the mask patterns 162.

The lower layer 160 and an upper portion of the upper insulating layer 150 may be etched using the mask patterns 162 on the first region R1 and the sacrificial pattern 175 as an etch mask. Accordingly, first trenches T1, which extend in the first direction D1, may be formed in the upper insulating layer 150 on the first region R1, and first holes H1, which are spaced apart from each other in the first direction D1, may be formed in the upper insulating layer 150 on the second region R2. The first trenches T1 and the first holes H1 may be simultaneously formed by a first etching process using the mask patterns 162 on the first region R1 and the sacrificial pattern 175 as an etch mask. In the upper insulating layer 150 on the first region R1, the first trenches T1 may extend in the first direction D1 and may be spaced apart from each other in the second direction D2. Each of the first trenches T1 may vertically (e.g., in the third direction D3) overlap a plurality of data storage patterns DS, which are arranged in the first direction D1. In the upper insulating layer 150 on the second region R2, the first holes H1 may be spaced apart from each other in the first direction D1 and may vertically (e.g., in the third direction D3) overlap the lower conductive lines 138, respectively, which are arranged in the first direction D1.

Figure 15:
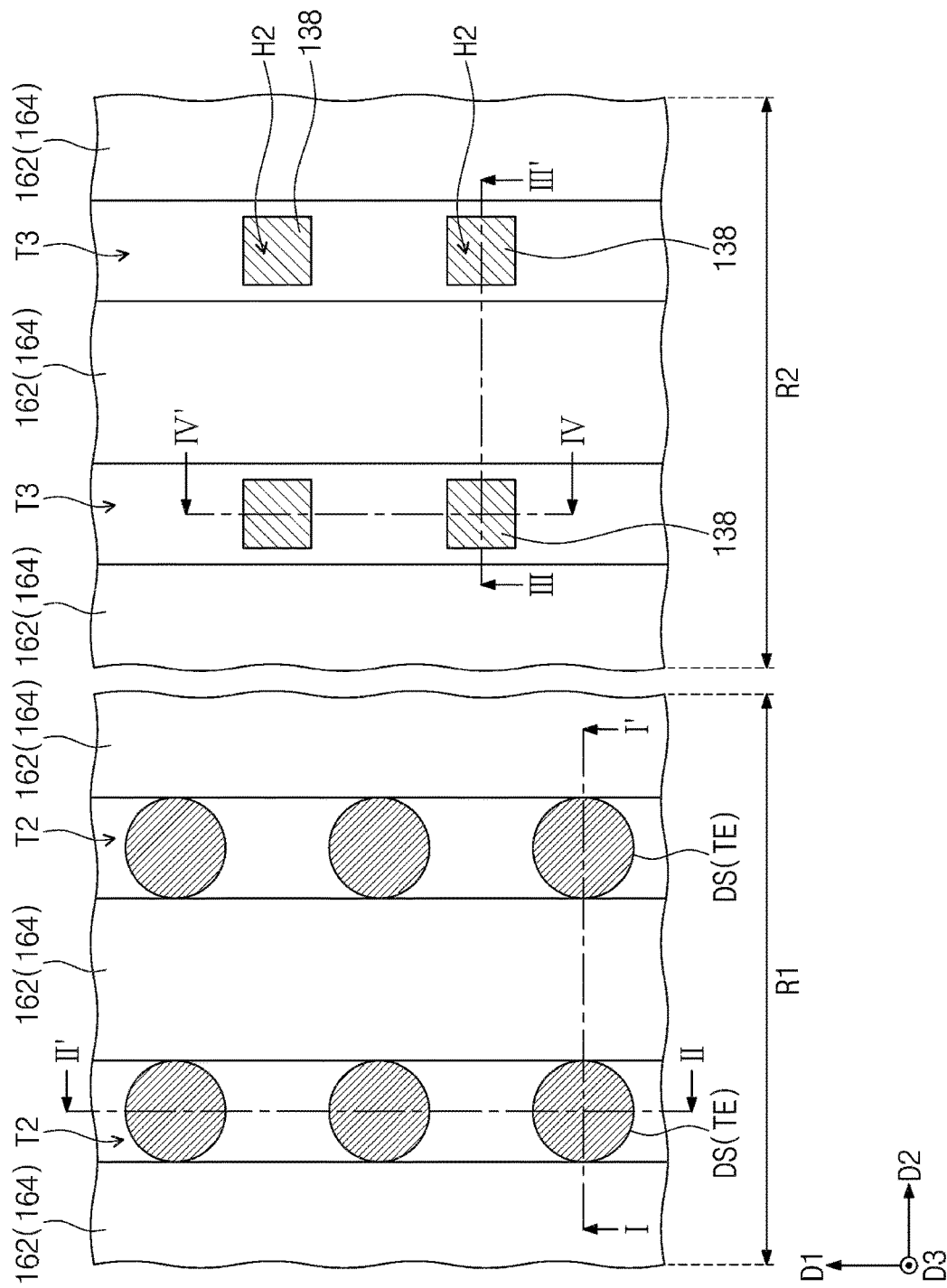
Figure 16:
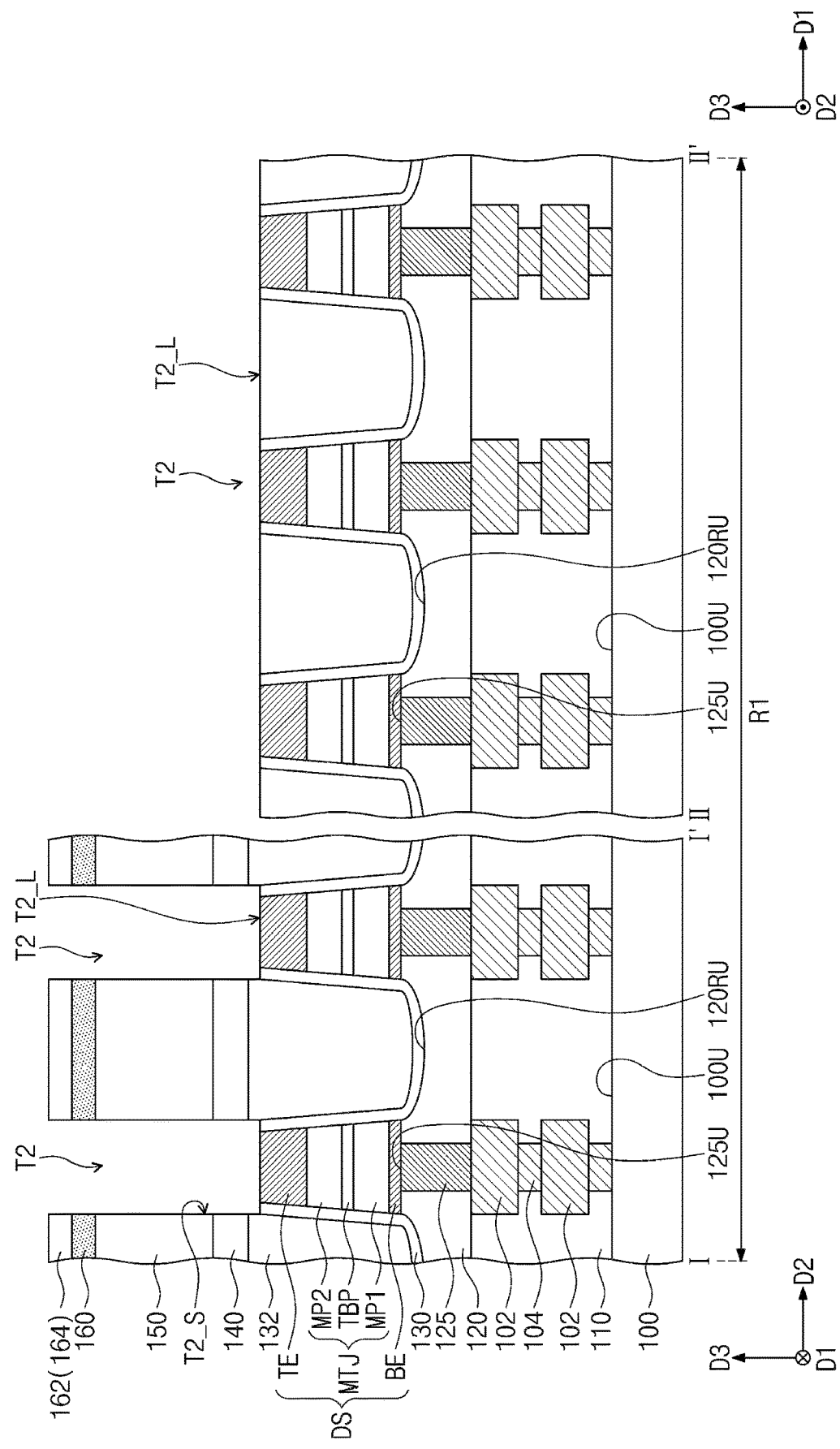
Figure 17:
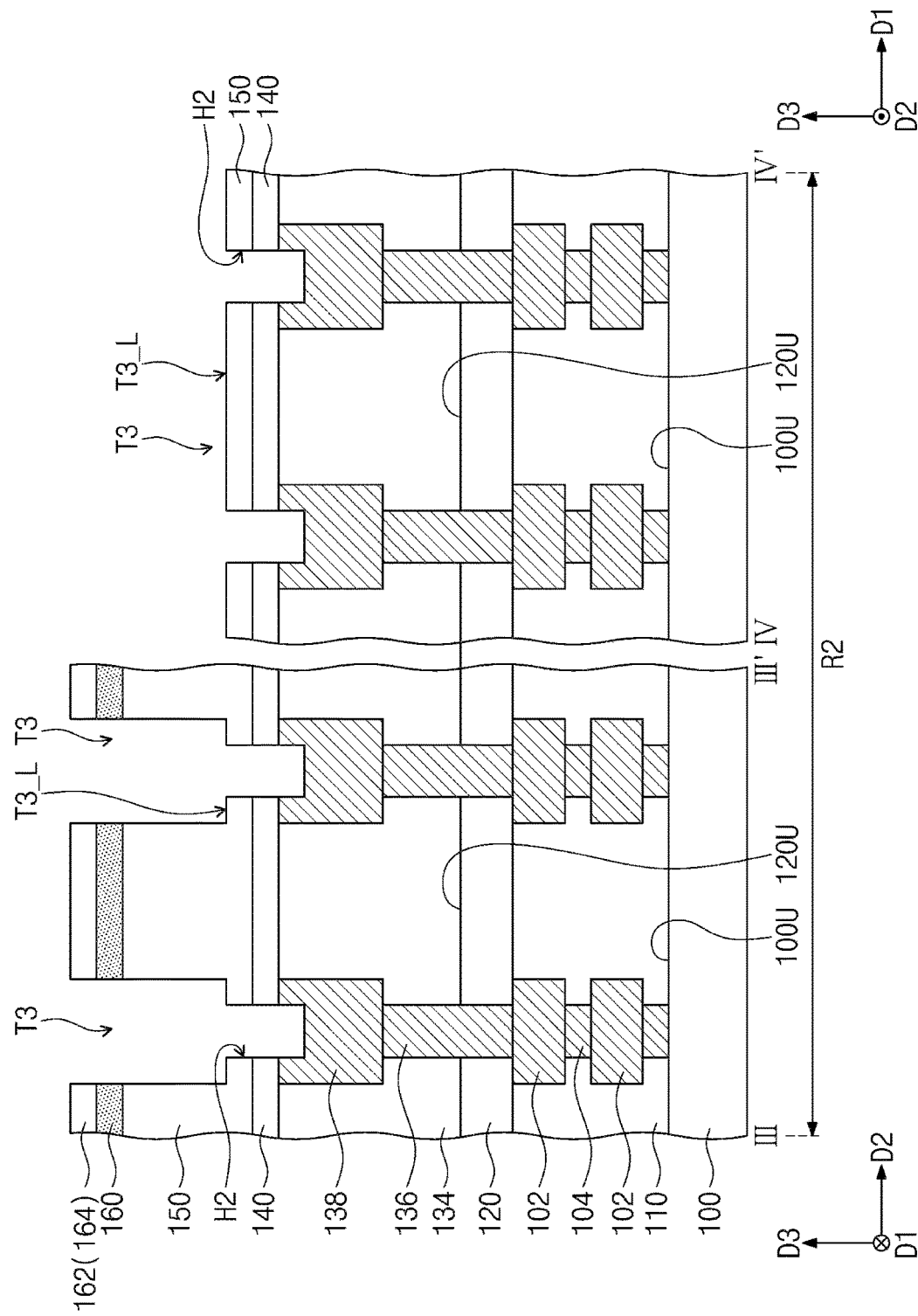

Referring to FIGS. 15 to 17, the sacrificial pattern 175 may be removed after the formation of the first trenches T1 and the first holes H1. For example, the sacrificial pattern 175 may be removed by an ashing and/or strip process. As a result of the removal of the sacrificial pattern 175, the mask patterns 162 on the second region R2 may be exposed.

A remaining portion of the upper insulating layer 150 and the insulating layer 140 may be etched using the mask patterns 162 on the first and second regions R1 and R2 as an etch mask. Accordingly, second trenches T2 may be formed in the upper insulating layer 150 on the first region R1 to extend in the first direction D1, third trenches T3 may be formed in the upper insulating layer 150 on the second region R2 to extend in the first direction D1, and second holes H2 may be formed along the bottom surface of each of the third trenches T3 to be spaced apart from each other in the first direction D1. The second trenches T2, the third trenches T3, and the second holes H2 may be simultaneously formed by a second etching process using the mask patterns 162 on the first and second regions R1 and R2 as an etch mask.

The second trenches T2 may be formed by etching portions of the upper insulating layer 150 exposed through the first trenches T1 Each of the second trenches T2 may be formed to penetrate the upper insulating layer 150 and the insulating layer 140 and to penetrate the protection insulating layer 130 on the top surface of the data storage pattern DS. The second trenches T2 may extend in the first direction D1 and may be spaced apart from each other in the second direction D2. Each of the second trenches T2 may be formed to have a bottom surface T2_L exposing the top surfaces of the data storage patterns DS, which are spaced apart from each other in the first direction D1. A side surface T2_S of each of the second trenches T2 may have a straight line shape, when viewed in a sectional view.

The third trenches T3 may be formed by etching the upper portion of the upper insulating layer 150 exposed by the mask patterns 162 on the second region R2. Each of the third trenches T3 may be formed to penetrate the upper portion of the upper insulating layer 150. The third trenches T3 may extend in the first direction D1 and may be spaced apart from each other in the second direction D2. A bottom surface T3_L of each of the third trenches T3 may be located at a height higher than the bottom surface T2_L of each of the second trenches T2, when measured from the substrate 100.

The second holes H2 may be formed by etching a lower portion of the upper insulating layer 150 exposed through the first holes H1. The second holes H2 may extend from the bottom surface T3_L of each of the third trenches T3 toward the substrate 100 and may be arranged along the bottom surface T3_L of each of the third trenches T3 to be spaced apart from each other in the first direction D1. Each of the second holes H2 may be formed to penetrate the lower portion of the upper insulating layer 150 and the insulating layer 140 and to expose the lower conductive line 138 of the lower connection structures 138 and 136.

The second mask pattern 166 of each of the mask patterns 162 may be removed during the second etching process for forming the second trenches T2, the third trenches T3, and the second holes H2.

In the case where the first trenches T1 are formed using additional mask patterns (e.g., additional photoresist patterns) which are provided on the mask patterns 162 and on the first region R1, the additional mask patterns may be misaligned to the mask patterns 162 on the first region R1, and in this case, the side surface T2_S of each of the second trenches T2 may have a profile failure, such as a bent or stepped shape.

According to an embodiment of the inventive concept, the first and second trenches T1 and T2 may be formed using the mask patterns 162 on the first region R1 as an etch mask. Thus, the side surface T2_S of each of the second trenches T2 may be formed to have a straight line shape, when viewed in a sectional view. In other words, the side surface T2_S of each of the second trenches T2 may not have the profile failure, such as the bent or stepped shape. In addition, when the first trenches T1 are formed on the first region R1, it may be unnecessary to form the additional mask patterns, and thus, the second trenches T2, the third trenches T3, and the second holes H2 may be simultaneously formed by a simplified fabrication process.

Referring back to FIGS. 2 to 4, a cell line structure 190 may be formed in each of the second trenches T2, and an upper connection structure 200 may be formed in each of the third trenches T3 and in the second holes H2, which are connected to each of the third trenches T3. The formation of the cell line structure 190 and the upper connection structure 200 may include forming a barrier layer on the upper insulating layer 150 to conformally cover inner surfaces of the second trenches T2, the third trenches T3, and the second holes H2, forming a conductive layer on the barrier layer to fill remaining portions of the second trenches T2, the third trenches T3, and the second holes H2, and planarizing the barrier layer and the conductive layer to expose a top surface of the upper insulating layer 150. As a result of the planarization process, the cell line structure 190 may be locally formed in each of the second trenches T2. The cell line structure 190 may include a cell barrier pattern 192, which conformally covers the inner surface of each of the second trenches T2, and a cell conductive line 194, which fills the remaining portion of each of the second trenches T2. As a result of the planarization process, the upper connection structure 200 may be locally formed in each of the third trenches T3 and in the second holes H2 connected thereto. The upper connection structure 200 may include an upper barrier pattern 202 conformally covering the inner surface of each of the third trenches T3 and the inner surfaces of the second holes H2, upper conductive contacts 206 filling the remaining portions of the second holes H2, and an upper conductive line 204 filling the remaining portion of each of the third trenches T3. The remaining portions of the mask patterns 162 (e.g., the first mask patterns 164 of the mask patterns 162) and the lower layer 160 may be removed by the planarization process.

According to an embodiment of the inventive concept, it may be possible to simplify a process of simultaneously forming the cell line structure 190 and the upper connection structure 200 and to increase a process margin in the fabrication process. In addition, it may be possible to inhibit/prevent a profile failure from occurring on the side surface 190S of the cell line structure 190, and thus, to inhibit/prevent a pattern failure from occurring in the cell line structure 190. Accordingly, it may be possible to easily fabricate a highly reliable semiconductor device.

Figure 18:
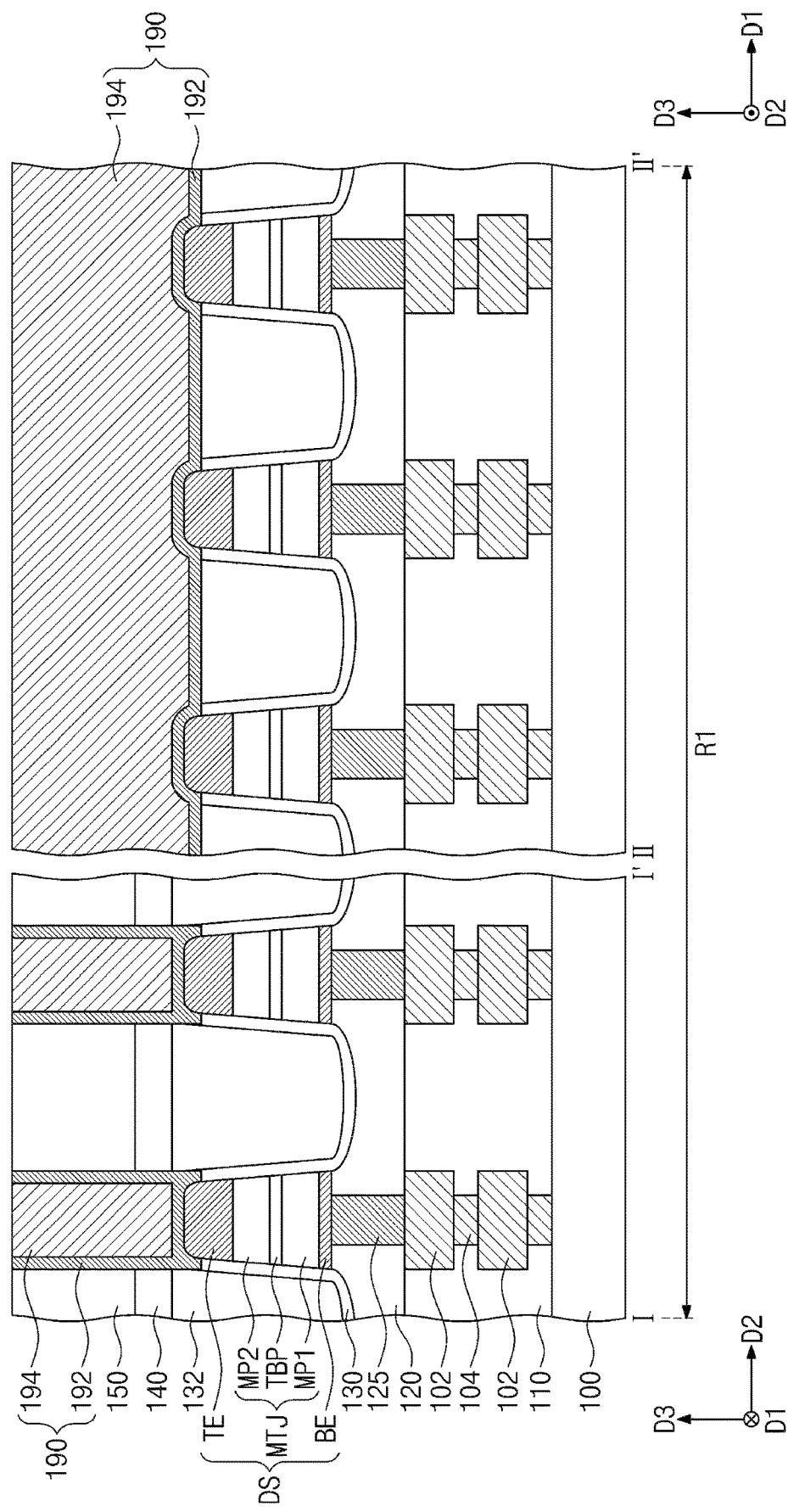
FIG. 18 is a sectional view, which is taken along lines I-I' and II-II' of FIG. 2 to illustrate a semiconductor device according to an embodiment of the inventive concept.

FIG. 18 is a sectional view, which is taken along lines I-I' and II-II' of FIG. 2 to illustrate a semiconductor device according to an embodiment of the inventive concept. For the sake of brevity, features, which are different from the semiconductor device described with reference to FIGS. 1 to 5B, will be mainly described below.

Referring to FIGS. 2 and 18, the cell line structure 190 may include the cell conductive line 194, which extends in the first direction D1, and the cell barrier pattern 192, which extends along the side and bottom surfaces of the cell conductive line 194. The cell conductive line 194 may be a single line-shaped pattern that extends longitudinally in the first direction D1. The cell barrier pattern 192 may extend along the bottom and side surfaces of the cell conductive line 194. The cell barrier pattern 192 may be interposed between the bottom surface of the cell conductive line 194 and the top surface DS_U of the data storage pattern DS and may be in direct contact with the top surface DS_U of the data storage pattern DS. The cell barrier pattern 192 may extend to a region on the side surface of the data storage pattern DS and may be in contact with a portion of the side surface of the data storage pattern DS. Except for the afore-described differences, the semiconductor device according to the present embodiment may be substantially the same as the semiconductor device described with reference to FIGS. 1 to 5B.

According to an embodiment of the inventive concept, it may be possible to simplify a process of simultaneously forming a cell line structure and an upper connection structure on respective regions (e.g., first and second regions) of a substrate and to increase a process margin in the forming process. In addition, it may be possible to inhibit/prevent a profile failure from occurring on a side surface of the cell line structure and thus the cell line structure may be formed without a pattern failure. Accordingly, it may be possible to easily fabricate a highly reliable semiconductor device.

While example embodiments of the inventive concept have been particularly shown and described, it will be understood by one of ordinary skill in the art that variations in form and detail may be made therein without departing from the scope of the attached claims.

What is claimed is:
1. A semiconductor device comprising:
  a substrate including a first region and a second region;
  a contact insulating layer on the first region of the substrate and extending onto the second region of the substrate;
  lower contact plugs penetrating the contact insulating layer on the first region of the substrate and spaced apart from each other in a first direction parallel to a top surface of the substrate;
  data storage patterns respectively on the lower contact plugs and spaced apart from each other in the first direction;
  lower conductive contacts penetrating the contact insulating layer on the second region of the substrate and spaced apart from each other in the first direction;
  lower conductive lines respectively on the lower conductive contacts and spaced apart from each other in the first direction;
  a first lower insulating layer on the contact insulating layer, on the first region of the substrate and interposed between the data storage patterns;
  a second lower insulating layer on the contact insulating layer, on the second region of the substrate and interposed between the lower conductive lines;
  a cell line structure on the data storage patterns and the first lower insulating layer, on the first region of the substrate, extending in the first direction, and electrically connected to the data storage patterns; and
  an upper connection structure on the lower conductive lines and the second lower insulating layer, on the second region of the substrate, and electrically connected to the lower conductive lines, wherein at least portions of the lower conductive lines are located at a same height as the data storage patterns, relative to the substrate, wherein the upper connection structure comprises an upper conductive line that extends in the first direction, and upper conductive contacts that are arranged along a bottom surface of the upper conductive line and are spaced apart from each other in the first direction, wherein the upper conductive contacts are connected to the lower conductive lines respectively, wherein the bottom surface of the upper conductive line is located at a height higher than a bottom surface of the cell line structure, relative to the substrate, wherein a side surface of the cell line structure has a straight line shape continuously extending between the bottom surface of the cell line structure and a top surface of the cell line structure, when viewed in a sectional view, and wherein the upper connection structure further comprises an upper barrier pattern and the upper conductive contacts are spaced apart from the lower conductive lines by the upper barrier pattern, and wherein the upper conductive contacts and the upper barrier pattern at least partially extend into the lower conductive lines.

2. The semiconductor device of claim 1, wherein the bottom surface of the cell line structure is in contact with top surfaces of the data storage patterns.

3. The semiconductor device of claim 2, wherein an angle between the side and bottom surfaces of the cell line structure is a right or obtuse angle.

4. The semiconductor device of claim 1, wherein the height of the bottom surface of the upper conductive line is lower than the top surface of the cell line structure, relative to the substrate.

5. The semiconductor device of claim 1,
wherein the cell line structure comprises:
a cell conductive line extending in the first direction; and
a cell barrier pattern extending along bottom and side surfaces of the cell conductive line, and
wherein the cell barrier pattern is interposed between the bottom surface of the cell conductive line and a top surface of each of the data storage patterns and is in contact with the top surface of each of the data storage patterns.

6. The semiconductor device of claim 5, wherein the cell conductive line is a single line-shaped pattern that extends continuously in the first direction from the top surface of a first data storage pattern of the data storage patterns to the top surface of a second data storage pattern of the data storage patterns.

7. The semiconductor device of claim 1,
wherein each of the data storage patterns comprises a bottom electrode, a magnetic tunnel junction pattern, and a top electrode, which are sequentially stacked in a direction perpendicular to the top surface of the substrate, and
wherein the bottom surface of the cell line structure is in contact with the top electrode of each of the data storage patterns.

8. The semiconductor device of claim 1,
wherein the lower conductive contacts extend into the second lower insulating layer and are electrically connected to the lower conductive lines respectively.

9. The semiconductor device of claim 8, further comprising:

wherein the second lower insulating layer comprises a material different from the first lower insulating layer.

10. The semiconductor device of claim 1, further comprising an interconnection structure on the first region and the second region of the substrate and between the substrate and the contact insulating layer,
wherein the interconnection structure comprises interconnection lines, which are vertically spaced apart from the substrate, and interconnection contacts that are electrically connected to the interconnection lines, and
wherein each of the lower contact plugs and the lower conductive contacts is electrically connected to a corresponding one of the interconnection lines.

11. The semiconductor device of claim 1, wherein the contact insulating layer has a curved top surface that is between a pair of the data storage patterns and is lower than respective top surfaces of the lower contact plugs.

12. The semiconductor device of claim 1, wherein the cell line structure comprises:
a cell conductive line that extends in the first direction; and
a cell barrier pattern that extends along bottom and side surfaces of the cell conductive line,
wherein the cell conductive line comprises the same material as the upper conductive line and the upper conductive contacts.

13. The semiconductor device of claim 12,
wherein the upper barrier pattern extends along a side surface and the bottom surface of the upper conductive line and extends from the bottom surface of the upper conductive line to cover side and bottom surfaces of each of the upper conductive contacts,
wherein the upper barrier pattern comprises the same material as the cell barrier pattern.

14. The semiconductor device of claim 1, wherein the upper conductive line and the upper conductive contacts comprise the same material.

15. A semiconductor device comprising:
a substrate including a first region and a second region;
a contact insulating layer on the first region of the substrate and extending onto the second region of the substrate;
a lower contact plug penetrating the contact insulating layer on the first region of the substrate;
a lower conductive contact penetrating the contact insulating layer on the second region of the substrate;
a data storage pattern on the contact insulating layer and on the lower contact plug;
a lower conductive line on the contact insulating layer and on the lower conductive contact;
a cell line structure on the first region of the substrate and on the data storage pattern electrically connected to the data storage pattern; and
an upper connection structure on the second region of the substrate and on the lower conductive line and electrically connected to the lower conductive line,
wherein at least a portion of the lower conductive line are horizontally overlapped with at least a portion of the data storage pattern,
wherein the upper connection structure comprises an upper conductive line that extends in a first direction parallel to a top surface of the substrate, and upper conductive contacts, which are arranged along a bottom surface of the upper conductive line and are spaced apart from each other in the first direction,
wherein the lower conductive line is connected to a corresponding one of the upper conductive contacts, wherein the bottom surface of the upper conductive line is located at a height higher than a bottom surface of the cell line structure, relative to the substrate, and wherein an entire side surface of the cell line structure has a straight line shape, when viewed in a sectional view, and wherein the upper connection structure further comprises an upper barrier pattern and the upper conductive contacts are spaced apart from the lower conductive line by the upper barrier pattern, and wherein the upper conductive contacts and the upper barrier pattern at least partially extend into the lower conductive line.

16. The semiconductor device of claim 15, wherein the bottom surface of the upper conductive line is located at a height lower than a top surface of the cell line structure, relative to the substrate.

17. The semiconductor device of claim 16, wherein the bottom surface of the cell line structure is in contact with a top surface of the data storage pattern.

* * * * *